United States Patent
Chen

(10) Patent No.: US 9,450,202 B2
(45) Date of Patent: Sep. 20, 2016

(54) ENVIRONMENTAL SENSITIVE ELECTRONIC DEVICE PACKAGE HAVING SIDE WALL BARRIER STRUCTURE

(71) Applicant: Industrial Technology Research Institute, Hsinchu (TW)

(72) Inventor: Kuang-Jung Chen, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 123 days.

(21) Appl. No.: 14/065,434

(22) Filed: Oct. 29, 2013

(65) Prior Publication Data

US 2014/0118640 A1  May 1, 2014

Related U.S. Application Data

(60) Provisional application No. 61/720,408, filed on Oct. 31, 2012.

(30) Foreign Application Priority Data

May 15, 2013  (TW) .............................. 102117228 A
Sep. 25, 2013  (TW) .............................. 102134567 A

(51) Int. Cl.
*H01L 51/52* (2006.01)
*G02F 1/1333* (2006.01)

(52) U.S. Cl.
CPC ..... *H01L 51/5246* (2013.01); *G02F 1/133308* (2013.01); *G02F 2001/133311* (2013.01); *G02F 2201/50* (2013.01); *H01L 51/5281* (2013.01)

(58) Field of Classification Search
CPC ............ G02F 1/133308; G02F 2001/133311; G02F 2202/28; H01L 21/56; H01L 23/564; H01L 51/5237; H01L 51/5259; G06F 1/1652; H05K 2201/10128; H05K 2201/2009; H05K 3/284
See application file for complete search history.

(56) References Cited

U.S. PATENT DOCUMENTS 7,652,424 B2  1/2010  Park et al.
8,093,512 B2  1/2012  Chen et al.
(Continued)

FOREIGN PATENT DOCUMENTS

EP  1779446  4/2011
JP  2010225362  10/2010
(Continued)

OTHER PUBLICATIONS

Fu et al., "Room Temperature Plasma Assisted Atomic Layer Deposition Al2O3 Film's Encapsulation Application in Organic Light Emitting Diodes," International Semiconductor Device Research Symposium (ISDRS), Dec. 7-9, 2011, pp. 1-2.
(Continued)

*Primary Examiner* — Huyen Ngo
(74) *Attorney, Agent, or Firm* — Jianq Chyun IP Office

(57) ABSTRACT

An environmental sensitive electronic device package having side wall barrier structure may include a first substrate, a second substrate, an environmental sensitive electronic device, a first adhesive, a third substrate, at least one first side wall barrier structure, and a second adhesive. The environmental sensitive electronic device is located on the first substrate. The first adhesive is located between the first and second substrates and covers the environmental sensitive electronic device. The third substrate is located below the first substrate. The first substrate is located between the second and third substrates. The first side wall barrier structure is located on the third substrate and between the first and the third substrates, wherein the first side wall barrier structure is embedded in the first substrate. The second adhesive is located between the first and third substrates and covers the second first side wall barrier structure.

19 Claims, 17 Drawing Sheets

(56) References Cited

U.S. PATENT DOCUMENTS

| | | | |
|---|---|---|---|
| 2009/0167132 A1 | 7/2009 | Bae et al. | |
| 2010/0258346 A1* | 10/2010 | Chen | H01L 21/56 174/521 |
| 2011/0272714 A1 | 11/2011 | Lhee | |
| 2014/0118975 A1* | 5/2014 | Chen | H05K 1/0281 361/761 |
| 2014/0160705 A1* | 6/2014 | Lee | H05K 3/284 361/760 |

FOREIGN PATENT DOCUMENTS

| | | |
|---|---|---|
| TW | 200524461 | 7/2005 |
| TW | 201205733 | 2/2012 |

OTHER PUBLICATIONS

Van Der Wel et al., "B-Dry®: Edge Sealant for Sensitive Photovoltaic Modules," Photovoltaic Specialists Conference (PVSC), 2011 37th IEEE, Jun. 19-24, 2011, pp. 001371-001374.

Li et al, "Thin Film Encapsulation of OLED Displays with Organic-Inorganic Composite Film," Electronic Components & Technology Conference, 2008, ECTC 2008. 58th, May 27-30, 2008, pp. 1819-1824.

Wang et al., "Direct Encapsulation of Organic Light-Emitting Devices (OLEDs) Using Photo-Curable co-Polyacrylate/Silica Nanocomposite Resin," IEEE Transactions on Advanced Packaging, Aug. 2007, pp. 421-427, vol. 30, No. 3.

Sang et al., "Thin Film Encapsulation for OLED Display using Silicon Nitride and Silicon Oxide Composite Film," International Conference on Electronic Packaging Technology and High Density Packaging (ICEPT-HDP), Aug. 8-11, 2011, pp. 1175-1178.

Zhang et al., "Effect of Encapsulation on OLED Characteristics with Anisotropic Conductive Adhesive," 2nd Electronics System-Integration Technology Conference, Sep. 1-4, 2008, pp. 613-616, Greenwich, UK.

"Office Action of Taiwan Counterpart Application", issued on Nov. 12, 2015, p. 1-p. 15.

* cited by examiner

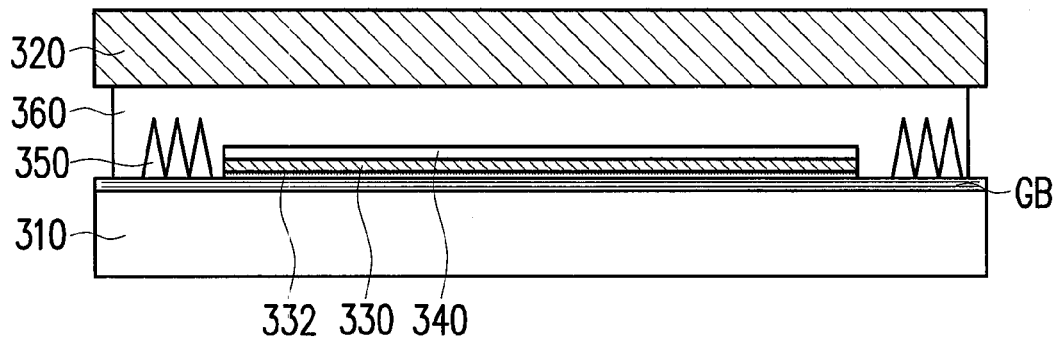
FIG. 3A         300A
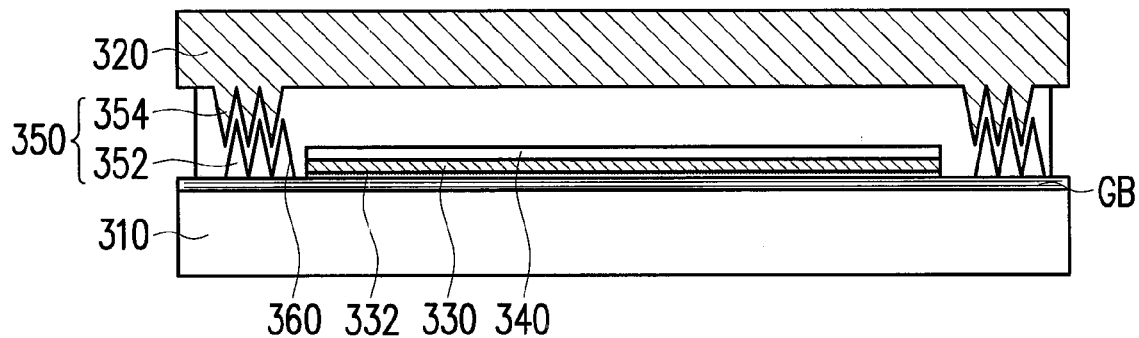
FIG. 3B         300B
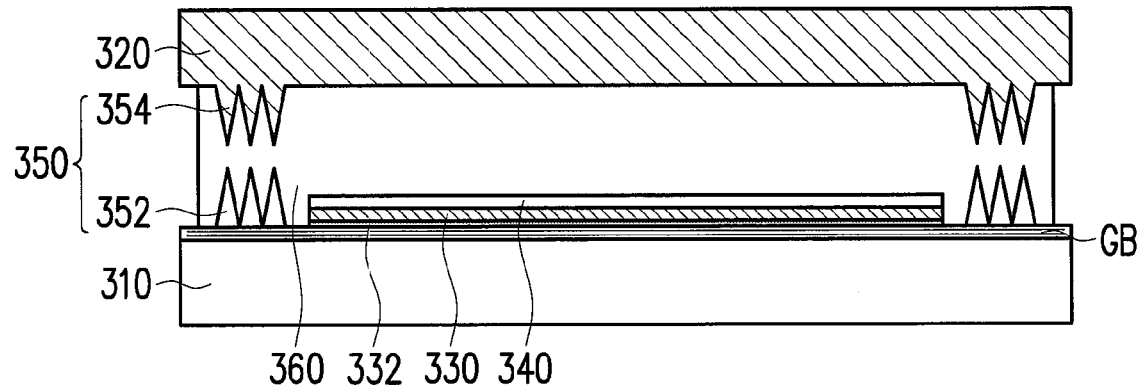
FIG. 3C         300C

ENVIRONMENTAL SENSITIVE ELECTRONIC DEVICE PACKAGE HAVING SIDE WALL BARRIER STRUCTURE

CROSS-REFERENCE TO RELATED APPLICATION

This application claims the priority benefits of U.S. provisional application Ser. No. 61/720,408, filed on Oct. 31, 2012, Taiwan application serial no. 102117228, filed on May 15, 2013, and Taiwan application serial no. 102134567, filed on Sep. 25, 2013. The entirety of each of the above-mentioned patent applications is hereby incorporated by reference herein and made a part of this specification.

TECHNICAL FIELD

The technical field relates to a package, and relates to an environmental sensitive electronic device package.

BACKGROUND

Flexible environmental sensitive electronic devices or display apparatuses are more applicable due to their bendability, portability, compliance with safety standards, and the wide range of applications. They have large coefficient of thermal expansion and poor resistance to heat, moisture, oxygen, and chemicals. The flexible substrate of the flexible environmental sensitive electronic device or the display apparatus may serve to hold electronic devices and/or act as a cover, so as to perform a packaging process on the electronic devices. Since the flexible substrate may not completely block the moisture and the oxygen, moisture infiltration and oxygen diffusion may damage the electronic devices on the flexible substrate. The lifetime of the electronic devices is shortened, and thus the electronic devices may not meet the market requirements.

SUMMARY

According to an exemplary embodiment of the disclosure, an environmental sensitive electronic device package that including a first substrate, a second substrate, an environmental sensitive electronic device, a first adhesive, a third substrate, at least one first side wall barrier structure, and a second adhesive is provided. The second substrate is located above the first substrate. The environmental sensitive electronic device is located on the first substrate and between the first substrate and the second substrate. The first adhesive is located between the first substrate and the second substrate and covers the environmental sensitive electronic device. The third substrate is located below the first substrate, and the first substrate is located between the second and third substrates. The first side wall barrier structure is located on the third substrate and between the first substrate and the third substrate, wherein the first side wall barrier structure is embedded in the first substrate. The second adhesive is located between the first and third substrates and covers the first side wall barrier structure.

According to another exemplary embodiment of the disclosure, an environmental sensitive electronic device package that includes a first substrate, a second substrate, an environmental sensitive electronic device, at least one first side wall barrier structure, a first adhesive, and a driver circuit is provided. The second substrate is located above the first substrate. The environmental sensitive electronic device is located on the first substrate and between the first substrate and the second substrate. The first side wall barrier structure is located on the second substrate and between the first substrate and the second substrate. At least one portion of the first side wall barrier structure surrounds the environmental sensitive electronic device, and the first side wall barrier structure has a cavity. The first adhesive is located between the first substrate and the second substrate and covers the first side wall barrier structure and the environmental sensitive electronic device. The driver circuit is located on the first substrate, between the first substrate and the second substrate, and in the cavity.

According to another exemplary embodiment of the disclosure, an environmental sensitive electronic device package that includes a first package substrate, a second package substrate, a carrier substrate, an environmental sensitive electronic device, at least one side wall barrier structure, and an adhesive is provided. The second package substrate is located above the first package substrate. The carrier substrate is located above the first package substrate and between the first package substrate and the second package substrate. The environmental sensitive electronic device is located on the carrier substrate and between the carrier substrate and the second package substrate. The side wall barrier structure is located between the first package substrate and the second package substrate, and at least one portion of the side wall barrier structure surrounds the environmental sensitive electronic device. The adhesive is located between the first package substrate and the second package substrate, and the adhesive covers the carrier substrate, the environmental sensitive electronic device, and the side wall barrier structure.

Several exemplary embodiments accompanied with figures are described in detail below to further describe the disclosure in details.

BRIEF DESCRIPTION OF DRAWINGS

The accompanying drawings are included to provide further understanding, and are incorporated in and constitute a part of this specification. The drawings illustrate exemplary embodiments and, together with the description, serve to explain the principles of the disclosure.

FIG. 1A' to FIG. 1E' are schematic cross-sectional diagrams respectively illustrating an environmental sensitive electronic device package according to another exemplary embodiment.

FIG. 2A-1 is a partial side view illustrating a region A in the environmental sensitive electronic device package depicted in FIG. 2A.

FIG. 2A-2 is a partial perspective view illustrating the region A in the environmental sensitive electronic device package depicted in FIG. 2A.

FIG. 2A-3 is another partial side view illustrating the region A in the environmental sensitive electronic device package depicted in FIG. 2A.

FIG. 2B-1 is a partial side view illustrating a region B in the environmental sensitive electronic device package depicted in FIG. 2B.

FIG. 2D' to FIG. 2F' are schematic cross-sectional diagrams respectively illustrating an environmental sensitive electronic device package according to another exemplary embodiment.

FIG. 3A is a schematic cross-sectional diagram illustrating an environmental sensitive electronic device package according to another exemplary embodiment.

FIG. 3B to FIG. 3D are schematic cross-sectional diagrams respectively illustrating an environmental sensitive electronic device package according to another exemplary embodiment.

FIG. 3D-1 is a partial side view illustrating a region C in the environmental sensitive electronic device package depicted in FIG. 3D.

FIG. 3E-1 is a partial side view illustrating a region D in the environmental sensitive electronic device package depicted in FIG. 3E.

FIG. 3F-1 is a partial side view illustrating a region E in the environmental sensitive electronic device package depicted in FIG. 3F.

DETAILED DESCRIPTION OF DISCLOSED EMBODIMENTS

Figure 1A:
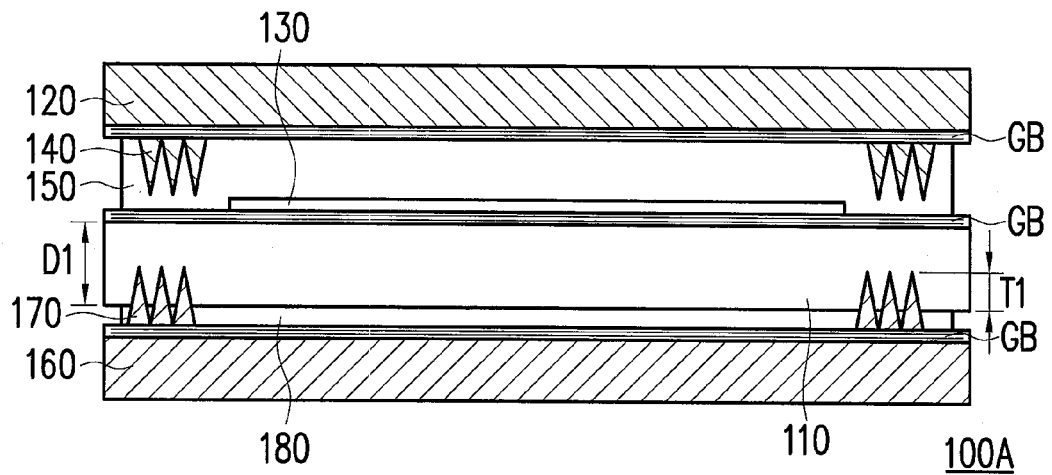
FIG. 1A is a schematic cross-sectional diagram illustrating an environmental sensitive electronic device package according to an exemplary embodiment.

In the following detailed description, for purposes of explanation, numerous specific details are set forth in order to provide a thorough understanding of the disclosed embodiments. One or more embodiments may be practiced without these specific details. Well-known structures and devices are schematically shown in order to simplify the drawing.

FIG. 1A is a schematic cross-sectional diagram illustrating an environmental sensitive electronic device package according to an exemplary embodiment. With reference to FIG. 1A, the environmental sensitive electronic device package 100A includes a first substrate 110, a second substrate 120, an environmental sensitive electronic device 130, at least one second side wall barrier structure 140, a first adhesive 150, a third substrate 160, al least one first side wall barrier structure 170, and a second adhesive 180. The second substrate 120 is located above the first substrate 110. The environmental sensitive electronic device 130 is located on the first substrate 110 and between the first substrate 110 and the second substrate 120. The second t side wall barrier structure 140 is located on the second substrate 120. At least one portion of the second side wall barrier structure 140 surrounds the environmental sensitive electronic device 130 and is located between the first substrate 110 and the second substrate 120. The first adhesive 150 is located between the first substrate 110 and the second substrate 120 and covers the second side wall barrier structure 140 and the environmental sensitive electronic device 130. The third substrate 160 is located below the first substrate 110, and the first substrate 110 is located between the second substrate 120 and the third substrate 160. The first side wall barrier structure 170 is located on the third substrate 160 and between the first substrate 110 and the third substrate 160, and the first side wall barrier structure 170 is embedded in the first substrate 110. The second adhesive 180 is located between the first substrate 110 and the third substrate 160 and covers the first side wall barrier structure 170.

In the present exemplary embodiment, the first substrate 110, the second substrate 120, and the third substrate 160 are flexible substrates, for instance, and the material of the flexible substrates may be polyethylene terephthalate (PET), polyethylene naphthalate (PEN), polyethersulfone (PES), polymethyl methacrylate (PMMA), polycarbonate (PC), polyimide (PI), ultra thin glass or metal foil. The second substrate 120 and the third substrate 160 may also be rigid substrates made of metal, glass, or the like, which should not be construed as a limitation to the disclosure.

The environmental sensitive electronic device 130 is, for instance, an active environmental sensitive electronic display device or a passive environmental sensitive electronic display device. The active environmental sensitive electronic display device is, for instance, an active matrix organic light emitting diode (AM-OLED), an active matrix electro phoretic display (AM-EPD) commonly known as electronic paper, an active matrix liquid crystal display (AM-LCD), or an active matrix blue phase liquid crystal display (AMBPLCD). The passive environmental sensitive electronic display device is, for instance, a passive matrix OLED (PM-OLED) or a super twisted nematic liquid crystal display (STN-LCD). The environmental sensitive electronic device 130 is placed on the first substrate 110 through a gas barrier film GB. That is, the first substrate 110 and the environmental sensitive electronic device 130 described herein are located at two respective sides of the gas barrier film GB, and the gas barrier film GB includes an organic film and an inorganic film. The inorganic film may refer to metal oxide, metal nitride, metal oxynitride, silicon oxide, silicon nitride, silicon oxynitride, and so on. In most cases, the gas impermeability of the inorganic film is greater than that of the organic film, while the organic film has favorable flexibility.

With reference to FIG. 1A, in the present exemplary embodiment, there are a number of second side wall barrier structures 140, for instance, and a shape of a cross-section of each second side wall barrier structure 140 perpendicular to the first substrate 110 may be a triangular shape, a trapezoidal shape, a rectangular shape, a polygonal shape, a circular shape, or an elliptic shape. Preferably, the cross-section of each second side wall barrier structure 140 perpendicular to the first substrate 110 is shaped as a triangle. The second side wall barrier structures 140 may be made of a combination of organic and inorganic materials. The organic material may be PI photoresist, and the inorganic material may be a silicon compound, an aluminum compound, a diamond like carbon film, and so forth. The triangular cross-section may be formed by performing a photolithography process on the organic material, and the inorganic material is coated onto the triangular cross-section through chemical vapor deposition (CVD) or sputtering, for instance. Besides, the triangular cross-section is formed on the second substrate 120. The cross-section may be made of metal or metal alloy and may be formed on the second substrate 120 through photolithography and etching, printing, or precision machining. The cross-section may also be made of glass and may be formed on the second substrate 120 through photolithography and etching or sandblasting, for instance. The gas barrier film GB is placed between the second substrate 120 and the second side wall barrier structures 140, and the gas barrier film GB includes an organic film and an inorganic film. The inorganic film may refer to metal oxide, metal nitride, metal oxynitride, silicon oxide, silicon nitride, silicon oxynitride, and so on. In most cases, the gas impermeability of the inorganic film is greater than that of the organic film, while the organic film has favorable flexibility.

The first adhesive 150 is, for instance, made of acrylic or epoxy resin that may be cured by ultraviolet light or heat, such that the first substrate 110 is closely bonded to the second substrate 120. In the present exemplary embodiment, before the first adhesive 150 is cured, the first adhesive 150 is of a liquid type or a sheet type, for instance.

There are a number of first side wall barrier structures 170, for instance, and a shape of a cross-section of each first side wall barrier structure 170 perpendicular to the first substrate 110 may be a triangular shape, a trapezoidal shape, a rectangular shape, a polygonal shape, a circular shape, or an elliptic shape. Preferably, the cross-section of each first side wall barrier structure 170 perpendicular to the first substrate 110 is shaped as a triangle. The first side wall barrier structures 170 may be made of a combination of organic and inorganic materials. The organic material may be PI photoresist, and the inorganic material may be a silicon compound, an aluminum compound, a diamond like carbon film, and so forth. The triangular cross-section may be formed by performing a photolithography process on the organic material, and the inorganic material is coated onto the triangular cross-section through CVD or sputtering, for instance. The triangular cross-section is formed on the third substrate 160. The cross-section may be made of metal or metal alloy and may be formed on the third substrate 160 through photolithography and etching, printing, or precision machining. The cross-section may also be made of glass and may be formed on the third substrate 160 through photolithography and etching or sandblasting, for instance. The gas barrier film GB is placed between the third substrate 160 and the first side wall barrier structures 170, and the gas barrier film GB includes an organic film and an inorganic film. The inorganic film may refer to metal oxide, metal nitride, metal oxynitride, silicon oxide, silicon nitride, silicon oxynitride, and so on. In most cases, the gas impermeability of the inorganic film is greater than that of the organic film, while the organic film has favorable flexibility.

An embedded depth T1 of each of the first side wall barrier structures 170 in the first substrate 110 is less than a thickness D1 of the first substrate 110, for instance, and a hardness of the first d side wall barrier structures 170 is greater than a hardness of the first substrate 110. After the third substrate 160 is laminated onto the first substrate 110, the third substrate 160 is closely bonded to the first substrate 110 through the second adhesive 180 by means of a properly exerted force from a roller or frame press, and the first side wall barrier structures 170 may then be easily embedded in the first substrate 110. The embedded depth T1 of each of the first side wall barrier structures 170 in the first substrate 110 is subject to the manufacturing process. During the roller pressing process or the frame pressing process, the exerted force may not be accurately controlled; the height of each first side wall barrier structure 170 is in principle less than the thickness D1 of the first substrate 110, for instance, so as to prevent the first side wall barrier structures 170 from penetrating the first substrate 110.

The second adhesive 180 applied for adhering the first substrate 110 and the third substrate 160 is the same as or similar to the first adhesive 150, for instance, and the second adhesive 180 is made of acrylic or epoxy resin that may be cured by ultraviolet light or heat, such that the first substrate 110 is closely bonded to the third substrate 160. In the present exemplary embodiment, before the second adhesive 180 is cured, the second adhesive 180 is of a liquid type or a sheet type, for instance.

The first side wall barrier structures 170 in the environmental sensitive electronic device package 100A are embedded in the first substrate 110 in the present exemplary embodiment, so as to effectively enhance the capability of the environmental sensitive electronic device package 100A for blocking moisture and oxygen. Thereby, the lifetime of the environmental sensitive electronic device 130 may be extended.

Different types of environmental sensitive electronic device packages 100B to 100K are described hereinafter with reference to FIG. 1B to FIG. 1K. The same or similar reference numbers used in each of the following exemplary embodiments represent the same or the like elements, and thus descriptions of the same or the like elements will not be repeatedly provided hereinafter.

Figure 1B:
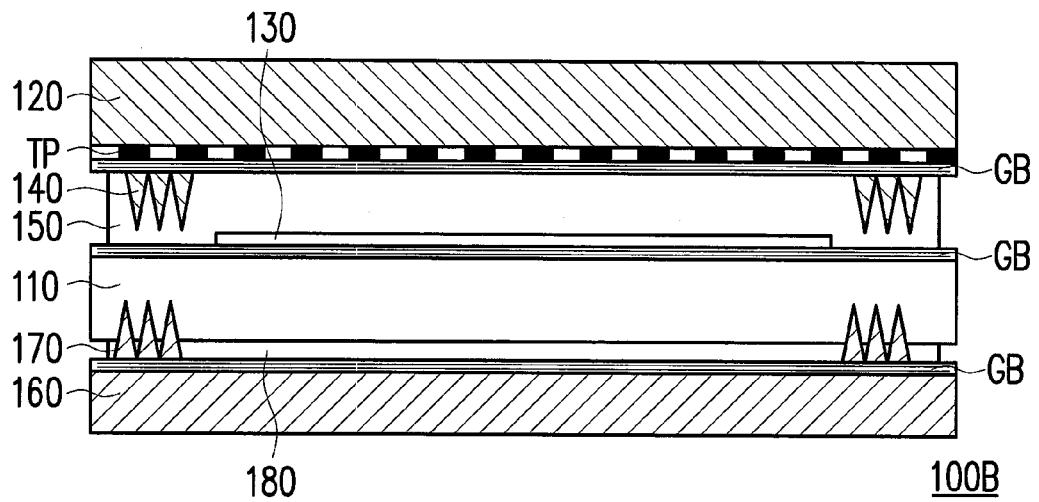
FIG. 1B to FIG. 1K are schematic cross-sectional diagrams respectively illustrating an environmental sensitive electronic device package according to another exemplary embodiment.

FIG. 1B to FIG. 1K are schematic cross-sectional diagrams respectively illustrating an environmental sensitive electronic device package according to another exemplary embodiment. With reference to FIG. 1B, the environmental sensitive electronic device package 100B shown in FIG. 1B is similar to the environmental sensitive electronic device package 100A shown in FIG. 1A, while the difference therebetween lies in that the environmental sensitive electronic device package 100B shown in FIG. 1B further includes a touch-sensing layer TP that is located on the second substrate 120 and between the second substrate 120 and the first adhesive 150 The touch-sensing layer TP described herein may be directly formed on the second substrate 120 or may be bonded to the second substrate 120 through an optical adhesive (not shown), for instance. Hence, the touch-sensing layer TP is, for instance, located between the gas barrier film GB and the second substrate 120, and the second side wall barrier structures 140 are located on the gas barrier film GB, i.e., the second substrate 120 and the second side wall barrier structures 140 are located at two respective side of the touch-sensing layer TP. The second side wall barrier structures 140 may be made of a combination of organic and inorganic materials. The organic material may be PI photoresist, and the inorganic material may be a silicon compound, an aluminum compound, a diamond like carbon film, and so forth. The triangular cross-section may be formed by performing a photolithography process on the organic material, and the inorganic material is coated onto the triangular cross-section through CVD or sputtering, for instance. The triangular cross-section is formed on the second substrate 120.

Figure 1C:
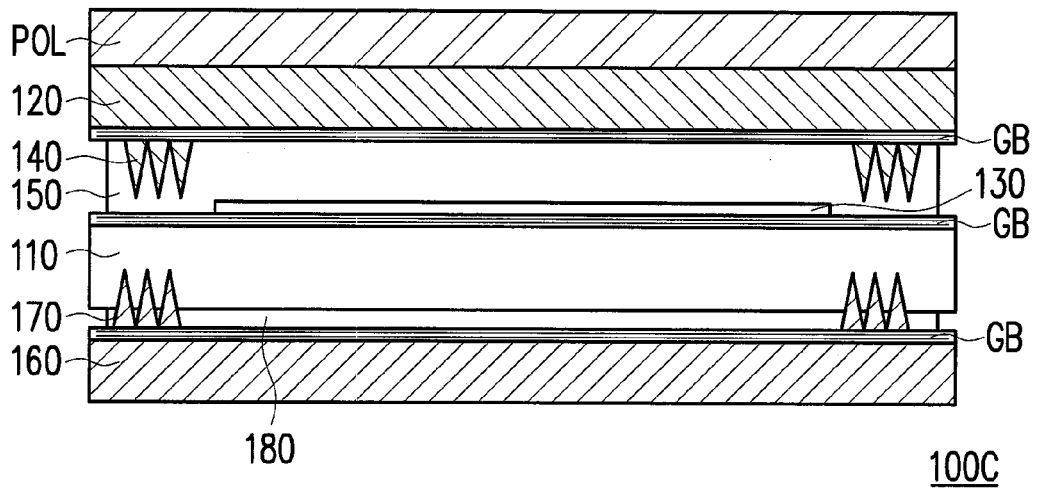

With reference to FIG. 1C, the environmental sensitive electronic device package 100C shown in FIG. 1C is similar to the environmental sensitive electronic device package 100A shown in FIG. 1A, while the difference therebetween lies in that the environmental sensitive electronic device package 100C shown in FIG. 1C further includes a quarter-wave compensating and polarizing film POL that is located on the second substrate 120, and the second substrate 120 is located between the quarter-wave compensating and polarizing film POL and the second adhesive 180. The quarter-wave compensating and polarizing film POL refers to a phase retardation film whose retardation has a magnitude of a quarter of a specific wavelength for the wavelength λ, for instance.

Figure 1D:
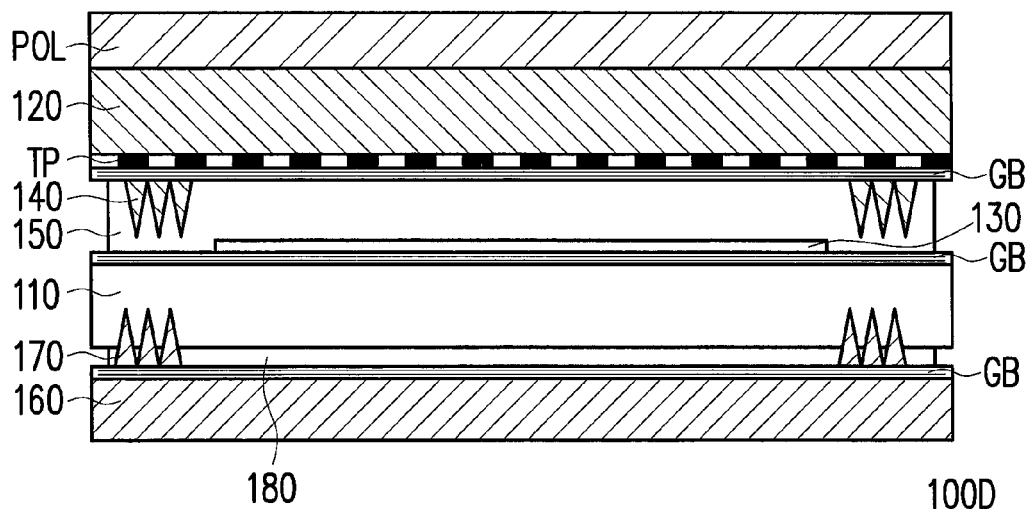

With reference to FIG. 1D, the environmental sensitive electronic device package 100D shown in FIG. 1D is similar to the environmental sensitive electronic device package 100B shown in FIG. 1B, while the difference therebetween lies in that the environmental sensitive electronic device package 100D shown in FIG. 1D further includes a quarter-wave compensating and polarizing film POL that is located on the second substrate 120, and the second substrate 120 is located between the quarter-wave compensating and polarizing film POL and the touch-sensing layer TP. In the quarter-wave compensating and polarizing film POL, the compensating film refers to a phase retardation film whose retardation has a magnitude of a quarter of a specific wavelength λ for the wavelength λ, for instance.

Figure 1E:
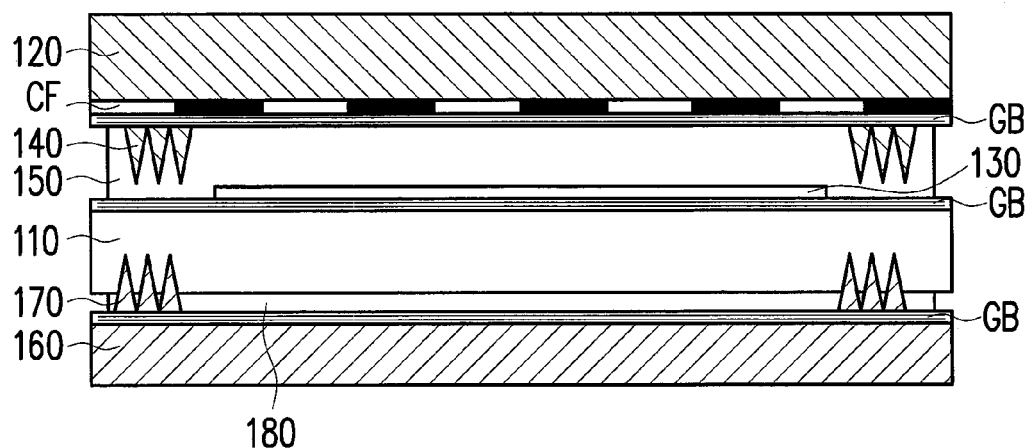

With reference to FIG. 1E, the environmental sensitive electronic device package 100E shown in FIG. 1E is similar to the environmental sensitive electronic device package 100A shown in FIG. 1A, while the difference therebetween lies in that the environmental sensitive electronic device package 100E shown in FIG. 1E further includes a color filter layer CF that is located on the second substrate 120 and between the second substrate 120 and the first adhesive 150. The color filter layer CF described herein may be directly formed on the second substrate 120 or may be bonded to the second substrate 120 through an optical adhesive (not shown); therefore, the color filter layer CF is, for instance, located between the gas barrier film GB and the second substrate 120, and the second side wall barrier structures 140 are located on the gas barrier film GB, i.e., the second substrate 120 and the second side wall barrier structures 140 are located at two respective side of the color filter layer CF. In the present exemplary embodiment, the second side wall barrier structures 140 may be made of a combination of organic and inorganic materials. The organic material may be PI photoresist, and the inorganic material may be a silicon compound, an aluminum compound, a diamond like carbon film, and so forth. The triangular cross-section may be formed by performing a photolithography process on the organic material, and the inorganic material is coated onto the triangular cross-section through CVD or sputtering, for instance. The triangular cross-section is formed on the second substrate 120.

Figure 1F:
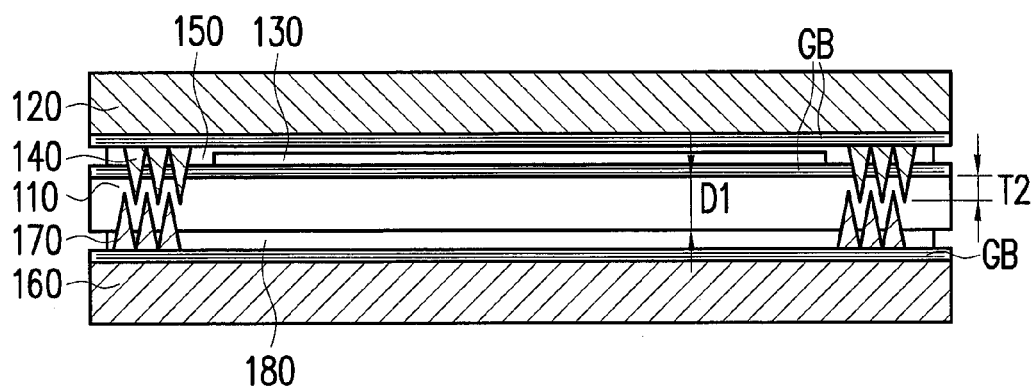

With reference to FIG. 1F, the environmental sensitive electronic device package 100F shown in FIG. 1F is similar to the environmental sensitive electronic device package 100A shown in FIG. 1A, while the difference therebetween lies in that the second side wall barrier structures 140 of the environmental sensitive electronic device package 100F are embedded in the first substrate 110, and the second side wall barrier structures 140 and the first side wall barrier structures 170 are alternately arranged in the first substrate 110, for instance. An embedded depth T2 of each of the second side wall barrier structures 140 in the first substrate 110 is less than the thickness D1 of the first substrate 110, for instance, and a hardness of the second side wall barrier structures 140 is preferably greater than the hardness of the first substrate 110. After the second substrate 120 is laminated onto the first substrate 110, the second substrate 120 is closely bonded to the first substrate 110 through the first adhesive 150 by means of a properly exerted force from a roller or frame press, and the second side wall barrier structures 140 may then be easily embedded in the first substrate 110.

The embedded depth T2 of each of the second side wall barrier structure 140 in the first substrate 110 is subject to the manufacturing process. During the roller pressing process or the frame pressing process, the exerted force may not be accurately controlled; therefore, the height of each second side wall barrier structure 140 is in principle less than the thickness D1 of the first substrate 110, for instance, so as to prevent the second side wall barrier structures 140 from penetrating the first substrate 110. The second side wall barrier structures 140 and the first side wall barrier structures 170 in the environmental sensitive electronic device package 100F are embedded in the first substrate 110 in the present exemplary embodiment, so as to effectively enhance the capability of the environmental sensitive electronic device package 100F for blocking moisture and oxygen. The lifetime of the environmental sensitive electronic device 130 may be extended.

Figure 1G:
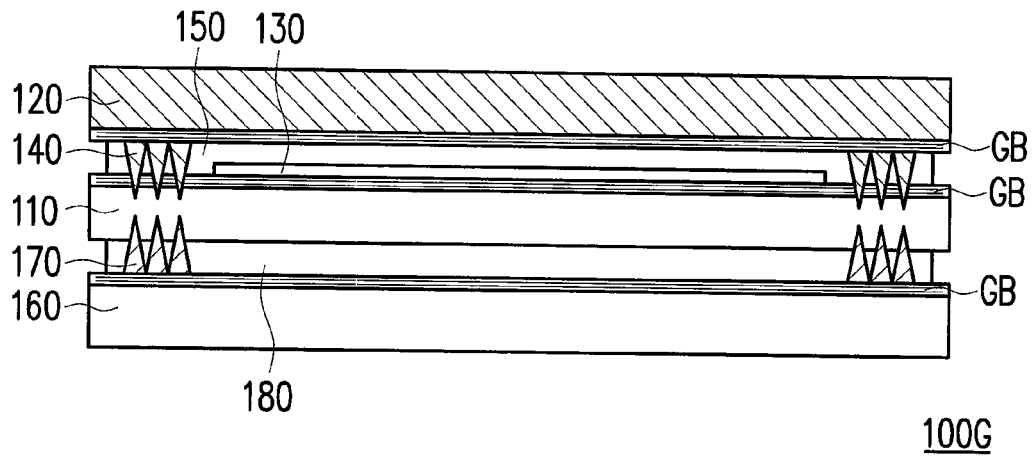

With reference to FIG. 1G, the environmental sensitive electronic device package 100G shown in FIG. 1G is similar to the environmental sensitive electronic device package 100F shown in FIG. 1F, while the difference therebetween lies in that the second side wall barrier structures 140 of the environmental sensitive electronic device package 100G are aligned to the first side wall barrier structures 170, for instance. The second side wall barrier structures 140 and the first side wall barrier structures 170 in the environmental sensitive electronic device package 100G are embedded in the first substrate 110 in the present exemplary embodiment, so as to effectively enhance the capability of the environmental sensitive electronic device package 100G for blocking moisture and oxygen. Thereby, the lifetime of the environmental sensitive electronic device 130 may be extended.

Figure 1H:
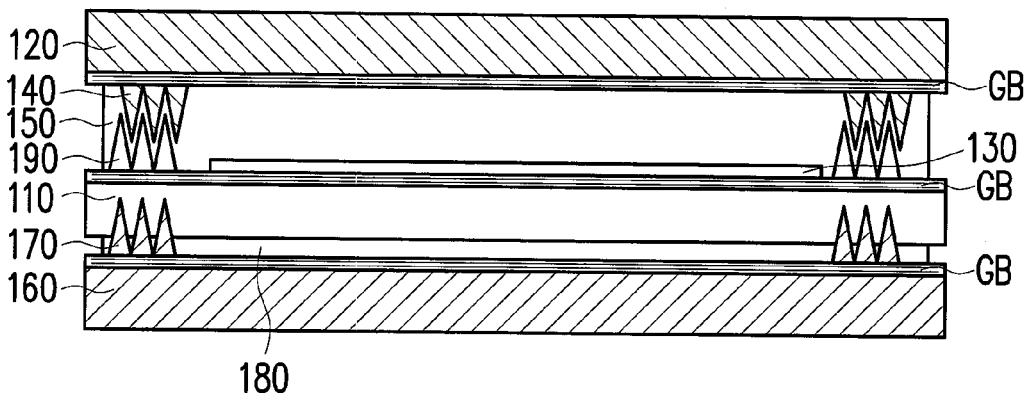

With reference to FIG. 1H, the environmental sensitive electronic device package 100H shown in FIG. 1H is similar to the environmental sensitive electronic device package 100A shown in FIG. 1A, while the difference therebetween lies in that the environmental sensitive electronic device package 100H shown in FIG. 1H further includes at least one third side wall barrier structure 190 that is located on the first substrate 110, and the third side wall barrier structure 190 and the second side wall barrier structures 140 are alternately arranged between the second substrate 120 and the first substrate 110. There are a number of third side wall barrier structures 190, for instance, and a shape of a cross-section of each third side wall barrier structure 190 perpendicular to the first substrate 110 may be a triangular shape, a trapezoidal shape, a rectangular shape, a polygonal shape, a circular shape, or an elliptic shape. Preferably, the cross-section of each third side wall barrier structure 190 perpendicular to the first substrate 110 is shaped as a triangle. The third side wall barrier structures 190 may be made of a combination of organic and inorganic materials. The organic material may be PI photoresist, and the inorganic material may be a silicon compound, an aluminum compound, a diamond like carbon film, and so forth. The triangular cross-section may be formed by performing a photolithography process on the organic material, and the inorganic material is coated onto the triangular cross-section through CVD or sputtering, for instance. The triangular cross-section is formed on the first substrate 110. The cross-section may be made of metal or metal alloy and may be formed on the first substrate 110 through photolithography and etching, printing, or precision machining. The cross-section may also be made of glass and may be formed on the first substrate 110 through photolithography and etching or sandblasting, for instance. The gas barrier film GB is placed between the first substrate 110 and the third side wall barrier structures 190, and the gas barrier film GB includes an organic film and an inorganic film. The inorganic film may refer to metal oxide, metal nitride, metal oxynitride, silicon oxide, silicon nitride, silicon oxynitride, and so on. In most cases, the gas impermeability of the inorganic film is greater than that of the organic film, while the organic film has favorable flexibility.

The first side wall barrier structures 170 in the environmental sensitive electronic device package 100H are embedded in the first substrate 110, and the third side wall barrier structures 190 and the second side wall barrier structures 140 are alternately arranged between the second substrate 120 and the first substrate 110 in the present exemplary embodiment, so as to effectively enhance the capability of the environmental sensitive electronic device package 100H for blocking moisture and oxygen. The lifetime of the environmental sensitive electronic device 130 may be extended.

Figure 1I:
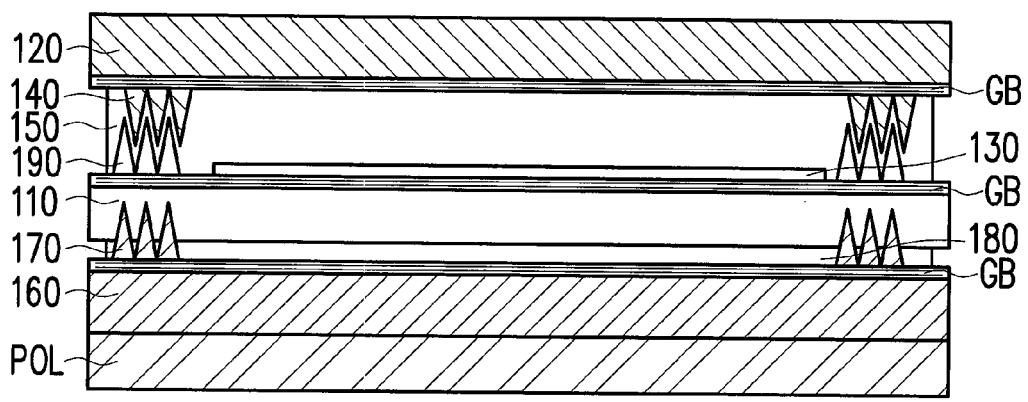

With reference to FIG. 1I, the environmental sensitive electronic device package 100I shown in FIG. 1I is similar to the environmental sensitive electronic device package 100H shown in FIG. 1H, while the difference therebetween lies in that the environmental sensitive electronic device package 100I shown in FIG. 1I further includes a quarter-wave compensating and polarizing film POL that is located on the third substrate 160, and the third substrate 160 is located between the quarter-wave compensating and polarizing film POL and the second adhesive 180. In the quarter-wave compensating and polarizing film POL, the compensating film refers to a phase retardation film whose retardation has a magnitude of a quarter of a specific wavelength $\lambda$ for the wavelength $\lambda$, for instance.

Figure 1J:
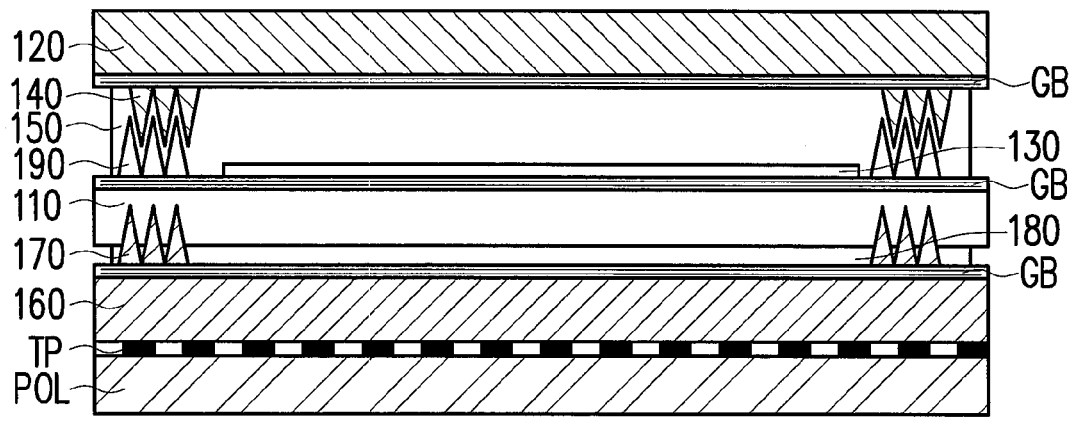

With reference to FIG. 1J, the environmental sensitive electronic device package 100J shown in FIG. 1J is similar to the environmental sensitive electronic device package 100I shown in FIG. 1I, while the difference therebetween lies in that the environmental sensitive electronic device package 100J shown in FIG. 1J further includes a touch-sensing layer TP that is located on the third substrate 160 and between the third substrate 160 and the quarter-wave compensating and polarizing film POL. The touch-sensing layer TP described herein may be directly formed on the third substrate 160 or may be bonded to the third substrate 160 through an optical adhesive (not shown), for instance, and the quarter-wave compensating and polarizing film POL is further configured on the touch-sensing layer TP. The touch-sensing layer TP may also be adhered to the third substrate 160 after the touch-sensing layer TP is bonded to the quarter-wave compensating and polarizing film POL, and the disclosure is not limited thereto.

Figure 1K:
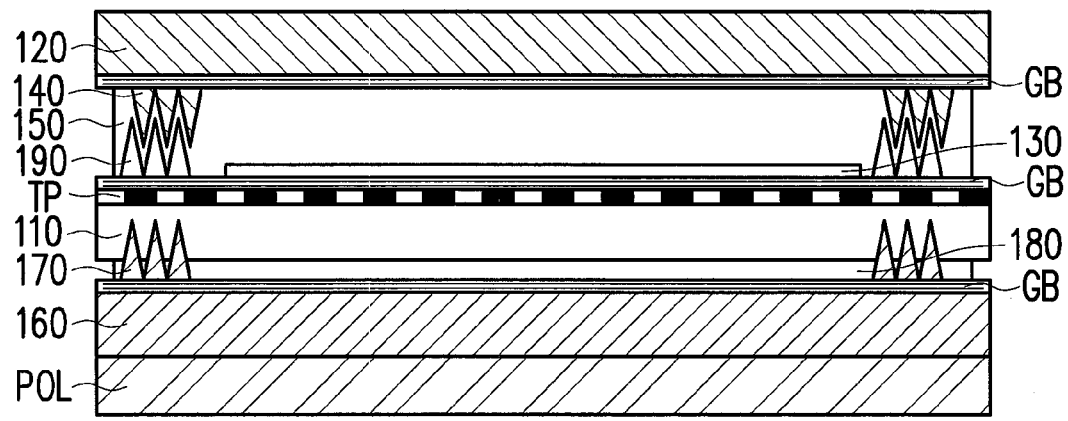
Figure 1A:
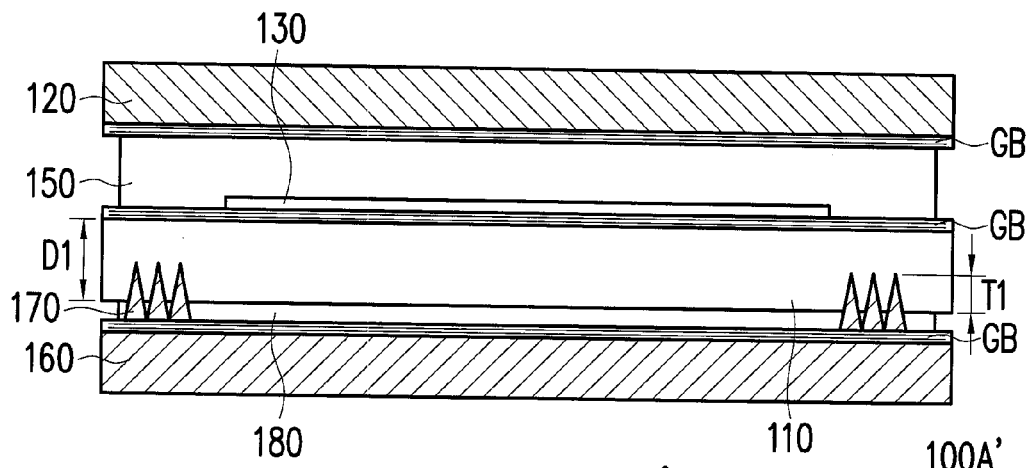
Figure 1B:
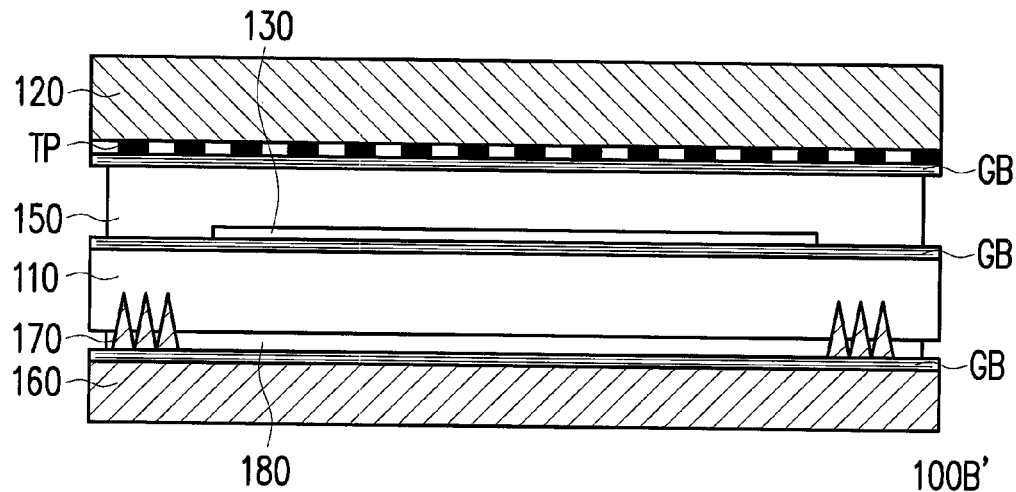
Figure 1C:
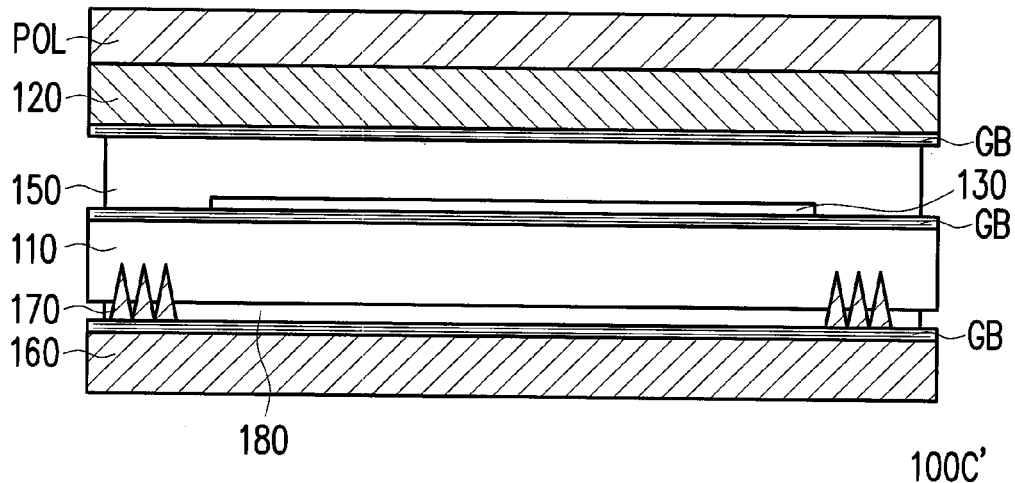
Figure 1D:
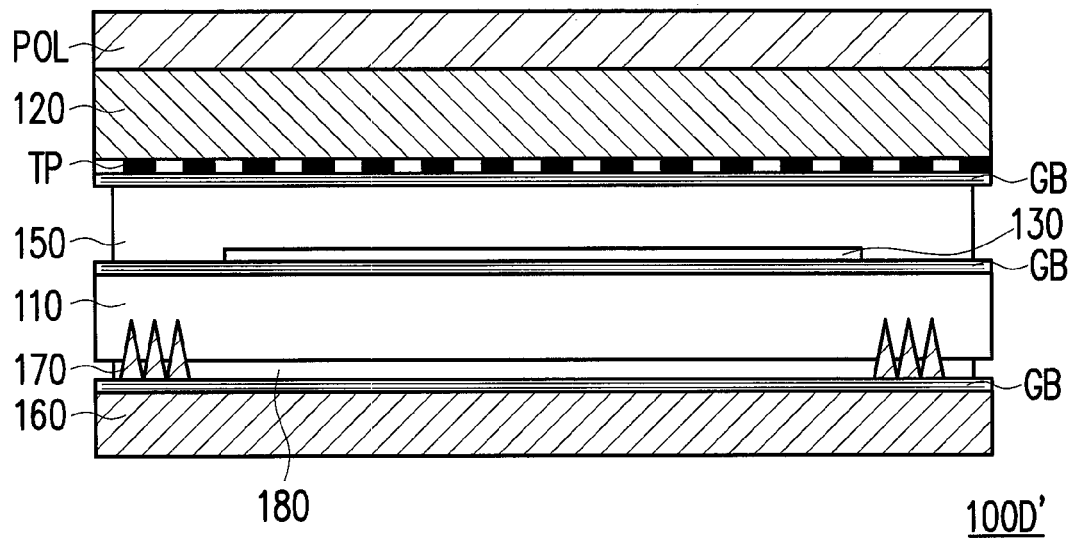
Figure 1E:
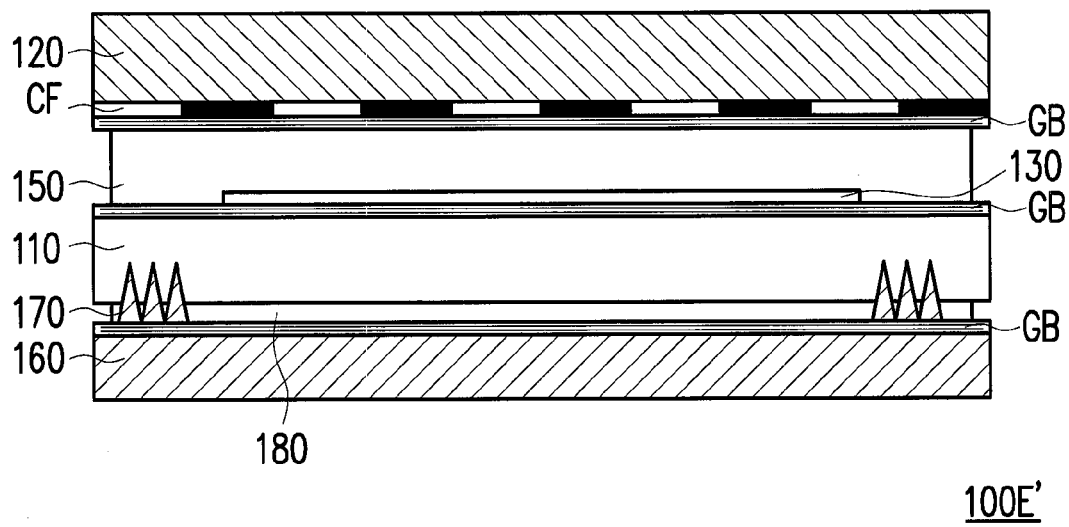

With reference to FIG. 1K, the environmental sensitive electronic device package 100K shown in FIG. 1K is similar to the environmental sensitive electronic device package 100I shown in FIG. 1I, while the difference therebetween lies in that the environmental sensitive electronic device package 100K shown in FIG. 1K further includes a touch-sensing layer TP that is located on the first substrate 110 and between the first substrate 110 and the environmental sensitive electronic device 130. The touch-sensing layer TP described herein may be directly formed on the first substrate 110 or may be bonded to the first substrate 110 through an optical adhesive (not shown); therefore, the touch-sensing layer TP is, for instance, located between the gas barrier film GB and the first substrate 110, and the third side wall barrier structures 190 are located on the gas barrier film GB, i.e., the first substrate 110 and the third side wall barrier structures 190 are located at two respective side of the touch-sensing layer TP. In the present exemplary embodiment, the third side wall barrier structures 190 may be made of a combination of organic and inorganic materials. The organic material may be PI photoresist, and the inorganic material may be a silicon compound, an aluminum compound, a diamond like carbon film, and so forth. The triangular cross-section may be formed by performing a photolithography process on the organic material, and the inorganic material is coated onto the triangular cross-section through CVD or sputtering, for instance. The triangular cross-section is formed on the first substrate 110. The cross-section may be made of metal or metal alloy and may be formed on the first substrate 110 through photolithography and etching, printing, or precision machining. The cross-section may also be made of glass and may be formed on the first substrate 110 through photolithography and etching or sandblasting, for instance.

FIG. 1A' to FIG. 1E' are schematic cross-sectional diagrams respectively illustrating an environmental sensitive electronic device package according to another exemplary embodiment. With reference to FIG. 1A' to FIG. 1E', the environmental sensitive electronic device packages 100A' to 100E' of FIG. 1A' to FIG. 1E' are similar to the environmental sensitive electronic device packages 100A to 100E of FIG. 1A to FIG. 1E respectively, while the difference therebetween lies in that the environmental sensitive electronic device packages 100A' to 100E' do not include the second side wall barrier structures 140 disposed on the second substrate 120. Through the first adhesive 150 that covers the environmental sensitive electronic device 130 and the first side wall barrier structures 170 that embed in the first substrate 110, the capability of blocking moisture and oxygen may also be effectively enhanced. Thereby, the lifetime of the environmental sensitive electronic device 130 may be extended.

The side wall barrier structures respectively in the environmental sensitive electronic device packages 100A to 100K and 100A' to 100E' are embedded in the substrate, so as to enhance the capability of the environmental sensitive electronic device packages 100A to 100K and 100A' to 100E' for blocking moisture and oxygen. The lifetime of the environmental sensitive electronic device may be effectively extended.

Figure 2A:
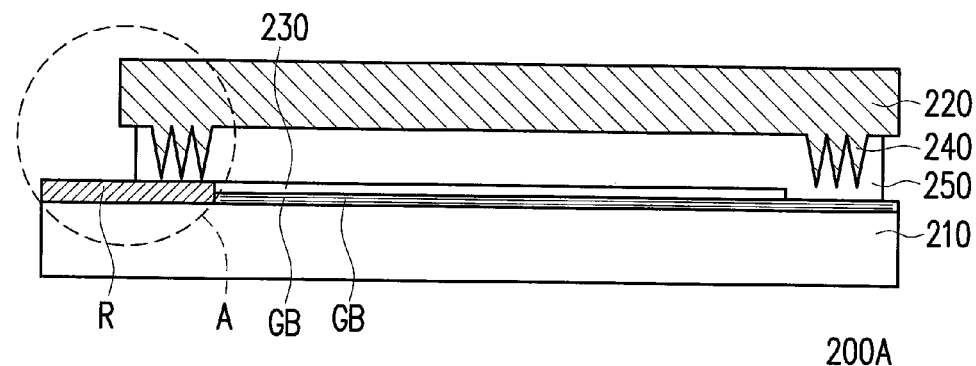
FIG. 2A illustrates an environmental sensitive electronic device package according to another exemplary embodiment.
Figures 1, 2A:
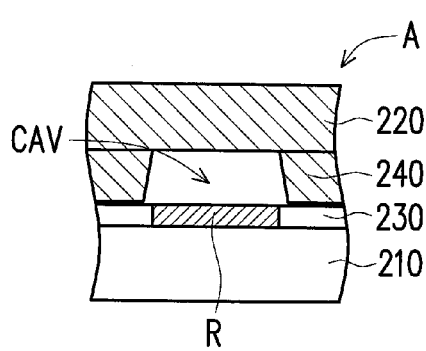
Figures 2, 2A:
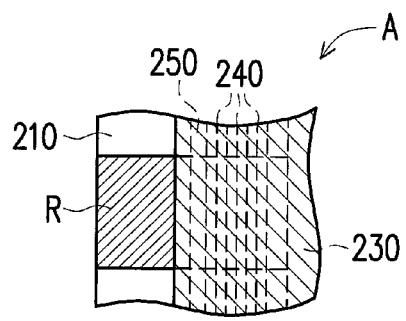
Figures 2, 2A, 3:
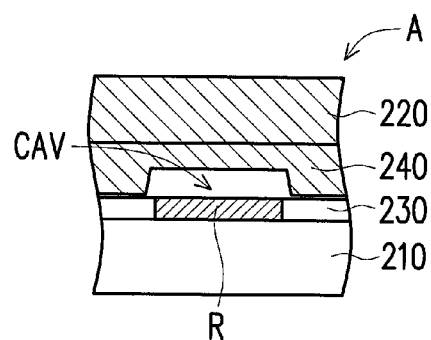

FIG. 2A illustrates an environmental sensitive electronic device package according to another exemplary embodiment. FIG. 2A-1 is a partial side view illustrating a region A in the environmental sensitive electronic device package depicted in FIG. 2A. FIG. 2A-2 is a partial perspective view illustrating the region A in the environmental sensitive electronic device package depicted in FIG. 2A. FIG. 2A-3 is another partial side view illustrating the region A in the environmental sensitive electronic device package depicted in FIG. 2A. With reference to FIG. 2A and FIG. 2A-1, the environmental sensitive electronic device package 200A includes a first substrate 210, a second substrate 220, an environmental sensitive electronic device 230, at least one first side wall barrier structure 240, a first adhesive 250, and a driver circuit R. The second substrate 220 is located above the first substrate 210. The environmental sensitive electronic device 230 is located on the first substrate 210 and between the first substrate 210 and the second substrate 220. The first side wall barrier structure 240 is located on the second substrate 220 and between the first substrate 210 and the second substrate 220. At least one portion of the first side wall barrier structure 240 surrounds the environmental sensitive electronic device 230, and the first side wall barrier structure 240 has a cavity CAV. The first adhesive 250 is located between the first substrate 210 and the second substrate 220 and covers the first side wall barrier structure 240 and the environmental sensitive electronic device 230. The driver circuit R is located on the first substrate 210, between the first substrate 210 and the second substrate 220, and in the cavity CAV.

In the present exemplary embodiment, the first substrate 210 and the second substrate 220 are flexible substrates, for instance, and the material of the flexible substrates may be PET, PEN, PES, PMMA, PC, PI, or metal foil. The first substrate 210 and the second substrate 220 may also be rigid substrates made of metal, glass, or the like, which should not be construed as a limitation to the disclosure.

The environmental sensitive electronic device 230 is, for instance, an active environmental sensitive electronic display device or a passive environmental sensitive electronic display device. The active environmental sensitive electronic display device is, for instance, an AM-OLED, an AM-EPD commonly known as electronic paper, an AM-LCD, or an AMBPLCD. The passive environmental sensitive electronic display device is, for instance, a PM-OLED or a STN-LCD The environmental sensitive electronic device 230 is placed on the first substrate 210 through a gas barrier film GB. The first substrate 110 and the environmental sensitive electronic device 230 described herein are located at two respective sides of the gas barrier film GB, and the gas barrier film GB includes an organic film and an inorganic film. The inorganic film may refer to metal oxide, metal nitride, metal oxynitride, silicon oxide, silicon nitride, silicon oxynitride, and so on. In most cases, the gas impermeability of the inorganic film is greater than that of the organic film, while the organic film has favorable flexibility.

With reference to FIG. 2A, in the present exemplary embodiment, there are a number of first side wall barrier structures 240, for instance, and a shape of a cross-section of each first side wall barrier structure 240 perpendicular to the first substrate 210 may be a triangular shape, a trapezoidal shape, a rectangular shape, a polygonal shape, a circular shape, or an elliptic shape. Preferably, the cross-section of each first side wall barrier structure 240 perpendicular to the first substrate 210 is shaped as a triangle. The first side wall barrier structures 240 may be made of a combination of organic and inorganic materials. The organic material may be PI photoresist, and the inorganic material may be a silicon compound, an aluminum compound, a diamond like carbon film, and so forth. The triangular cross-section may be formed by performing a photolithography process on the organic material, and the inorganic material is coated onto the triangular cross-section through CVD or sputtering, for instance. The triangular cross-section is formed on the second substrate 220. The cross-section may be made of metal or metal alloy and may be formed on the second substrate 220 through photolithography and etching, printing, or precision machining. The cross-section may also be made of glass and may be formed on the second substrate 220 through photolithography and etching or sandblasting, for instance.

The first adhesive 250 is, for instance, made of acrylic or epoxy resin that may be cured by ultraviolet light or heat, such that the first substrate 210 is closely bonded to the second substrate 220. In the present exemplary embodiment, before the first adhesive 250 is cured, the first adhesive 250 is of a liquid type or a sheet type, for instance.

As shown in FIG. 2A-1, each of the first side wall barrier structures 240 has a cavity CAV formed by etching each first side wall barrier structure 240 after the first side wall barrier structures 240 are formed on the second substrate 220, for instance. The cavity CAV may also be formed by photolithography and etching, printing, or precise machining while the first side wall barrier structures 240 are formed, which should not be construed as a limitation to the disclosure. In another aspect, as shown in FIG. 2A-3, a communication area is formed on the first side wall barrier structure 240 by the cavity CAV. That is, the driver circuit R which is configured in the cavity CAV may not be squeezed and damaged during the packaging process, so as to ensure that the driver circuit R may be electrically connected to the environmental sensitive electronic device 230. The cavities of the side wall barrier structures described herein may be as shown in FIG. 2A-3, i.e., an opening of a cross-section of the cavity CAV perpendicular to the first substrate 210 (as shown in FIG. 2A-3) is smaller than an opening of a cross-section of the cavity CAV perpendicular to the first substrate 210 shown in FIG. 2A-1.

Different types of environmental sensitive electronic device packages 200B to 200F are described hereinafter with reference to FIG. 2B to FIG. 2F. The same or similar reference numbers used in each of the following exemplary embodiments represent the same or the like elements, and thus descriptions of the same or the like elements will not be repeatedly provided hereinafter.

Figure 2B:
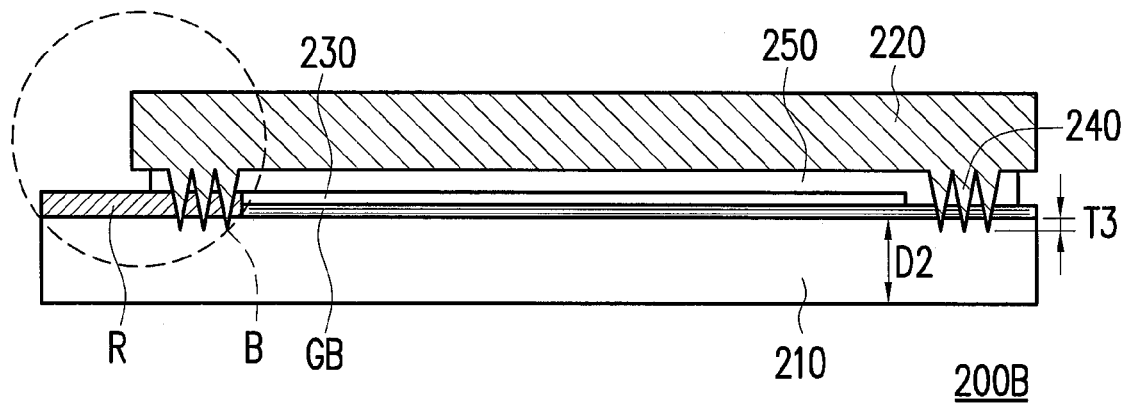
FIG. 2B is a schematic cross-sectional diagram illustrating an environmental sensitive electronic device package according to another exemplary embodiment.
Figures 1, 2B:
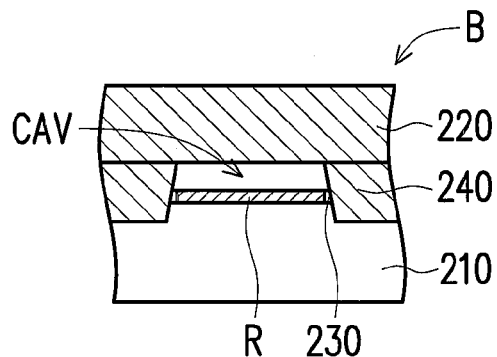

FIG. 2B to FIG. 2F are schematic cross-sectional diagrams respectively illustrating an environmental sensitive electronic device package according to another exemplary embodiment. FIG. 2B-1 is a partial side view illustrating a region B in the environmental sensitive electronic device package depicted in FIG. 2B. With reference to FIG. 2B and FIG. 2B-1, the environmental sensitive electronic device package 200B shown in FIG. 2B is similar to the environmental sensitive electronic device package 200A shown in FIG. 2A, while the difference therebetween lies in that the first side wall barrier structures 240 of the environmental sensitive electronic device package 200B are embedded in the first substrate 210. An embedded depth T3 of each of the first side wall barrier structures 240 in the first substrate 210 is less than a thickness D2 of the first substrate 210, for instance, and a hardness of the first side wall barrier structures 240 is preferably greater than a hardness of the first substrate 210. After the second substrate 220 is laminated onto the first substrate 210, the second substrate 220 is closely bonded to the first substrate 210 through the first adhesive 250 by means of a properly exerted force from a roller or frame press, and the first side wall barrier structures 240 may then be easily embedded in the first substrate 210. The embedded depth T3 of each of the first side wall barrier structures 240 in the first substrate 210 is subject to the manufacturing process. During the roller pressing process or the frame pressing process, the exerted force may not be accurately controlled; therefore, the height of each first side wall barrier structure 240 is in principle less than the thickness D2 of the first substrate 210, for instance, so as to prevent the first side wall barrier structures 240 from penetrating the first substrate 210.

As shown in FIG. 2B-1, a communication area is formed between the first side wall barrier structure 240 and the first substrate 210 by the cavity CAV of the first side wall barrier structure 240. That is, the driver circuit R which is configured in the cavity CAV may not be squeezed and damaged during the packaging process, so as to ensure that the driver circuit R may be electrically connected to the environmental sensitive electronic device 230.

Figure 2C:
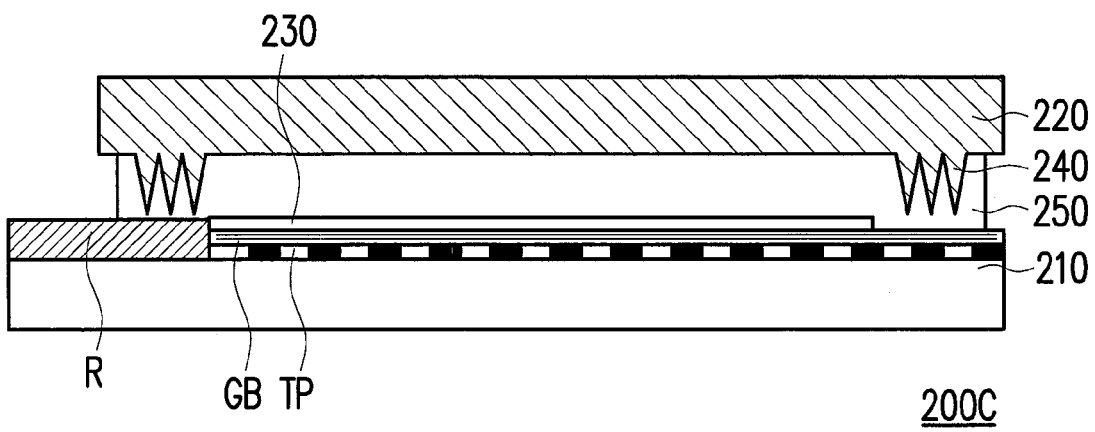
FIG. 2C to FIG. 2F are schematic cross-sectional diagrams respectively illustrating an environmental sensitive electronic device package according to another exemplary embodiment.

With reference to FIG. 2C, the environmental sensitive electronic device package 200C shown in FIG. 2C is similar to the environmental sensitive electronic device package 200A shown in FIG. 2A, while the difference therebetween lies in that the environmental sensitive electronic device package 200C shown in FIG. 2C further includes a touch-sensing layer TP that is located on the first substrate 210 and between the first adhesive 250 and the first substrate 210. The touch-sensing layer TP described herein may be formed on the first substrate 210; the touch-sensing layer TP is located between the gas barrier film GB and the first substrate 210, for instance, and the environmental sensitive electronic device 230 is located on the gas barrier film GB. That is, in the present exemplary embodiment, the environmental sensitive electronic device 230 and the touch-sensing layer TP are located at two respective sides of the gas barrier film GB, for instance.

Figure 2D:
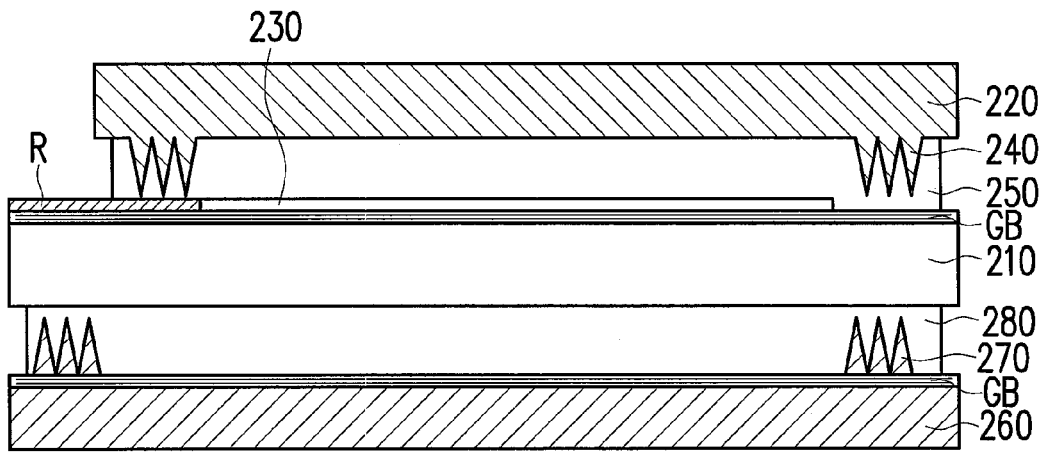

With reference to FIG. 2D, the environmental sensitive electronic device package 200D shown in FIG. 2D is similar to the environmental sensitive electronic device package 200A shown in FIG. 2A, while the difference therebetween lies in that the environmental sensitive electronic device package 200D further includes a third substrate 260, at least one second side wall barrier structure 270, and a second adhesive 280. The third substrate 260 is located below the first substrate 210, and the first substrate 210 is located between the second substrate 220 and the third substrate 260. The second side wall barrier structure 270 is located on the third substrate 260 and between the first substrate 210 and the third substrate 260. The second adhesive 280 is located between the first substrate 210 and the third substrate 260 and covers the second side wall barrier structure 270.

In the present exemplary embodiment, the third substrate 260 is a flexible substrate, for instance, and the material of the flexible substrate may be PET, PEN, PES, PMMA, PC, PI, or metal foil. The third substrate 260 may also be a rigid substrate made of metal, glass, or the like, which should not be construed as a limitation to the disclosure.

As shown in FIG. 2D, in the present exemplary embodiment, there are a number of second side wall barrier structures 270, for instance, and a shape of a cross-section of each second side wall barrier structure 270 perpendicular to the first substrate 210 may be a triangular shape, a trapezoidal shape, a rectangular shape, a circular shape, or an elliptic shape. Preferably, the cross-section of each second side wall barrier structure 270 perpendicular to the first substrate 210 is shaped as a triangle. The second side wall barrier structures 270 may be made of a combination of organic and inorganic materials. The organic material may be PI photoresist, and the inorganic material may be a silicon compound, an aluminum compound, a diamond like carbon film, and so forth. The triangular cross-section may be formed by performing a photolithography process on the organic material, and the inorganic material is coated onto the triangular cross-section through CVD or sputtering, for instance. The triangular cross-section is formed on the third substrate 260. The cross-section may be made of metal or metal alloy and may be formed on the third substrate 260 through photolithography and etching, printing, or precision machining. The cross-section may also be made of glass and may be formed on the third substrate 260 through photolithography and etching or sandblasting. The gas barrier film GB is placed between the third substrate 260 and the second side wall barrier structures 270, and the gas barrier film GB includes an organic film and an inorganic film. The inorganic film may refer to metal oxide, metal nitride, metal oxynitride, silicon oxide, silicon nitride, silicon oxynitride, and so on. In most cases, the gas impermeability of the inorganic film is greater than that of the organic film, while the organic film has favorable flexibility.

The second adhesive 280 is, for instance, made of acrylic or epoxy resin that may be cured by ultraviolet light or heat, such that the first substrate 210 is closely bonded to the third substrate 260. In the present exemplary embodiment, the second adhesive 280 is of a pressure-sensitive type or a fill type, for instance.

Figure 2E:
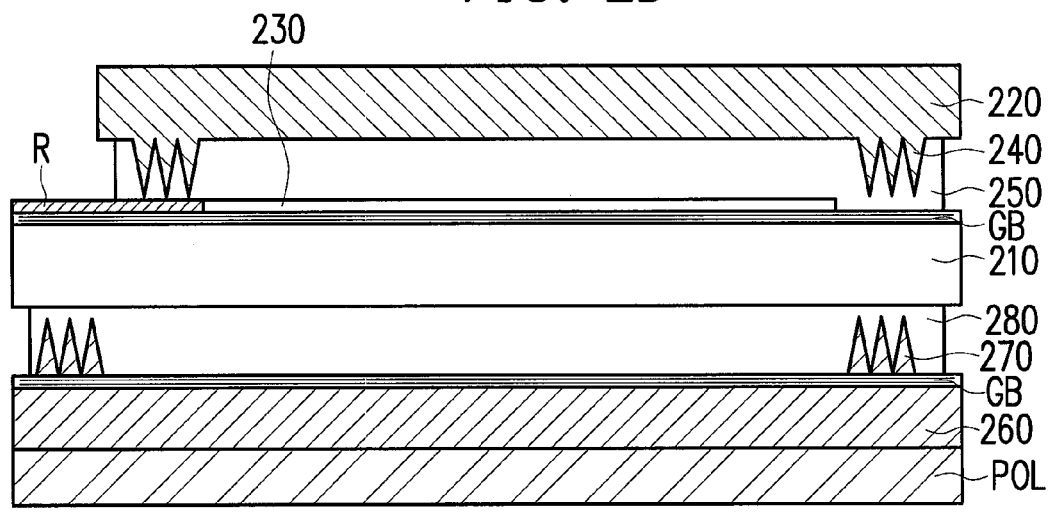

With reference to FIG. 2E, the environmental sensitive electronic device package 200E shown in FIG. 2E is similar to the environmental sensitive electronic device package 200D shown in FIG. 2D, while the difference therebetween lies in that the environmental sensitive electronic device package 200E shown in FIG. 2E further includes a quarter-wave compensating and polarizing film POL that is located on the third substrate 260, and the quarter-wave compensating and polarizing film POL and the second adhesive 280 are located at two respective sides of the third substrate 260. In the quarter-wave compensating and polarizing film POL, the compensating film refers to a phase retardation film whose retardation has a magnitude of a quarter of a specific wavelength λ for the wavelength λ, for instance.

Figure 2F:
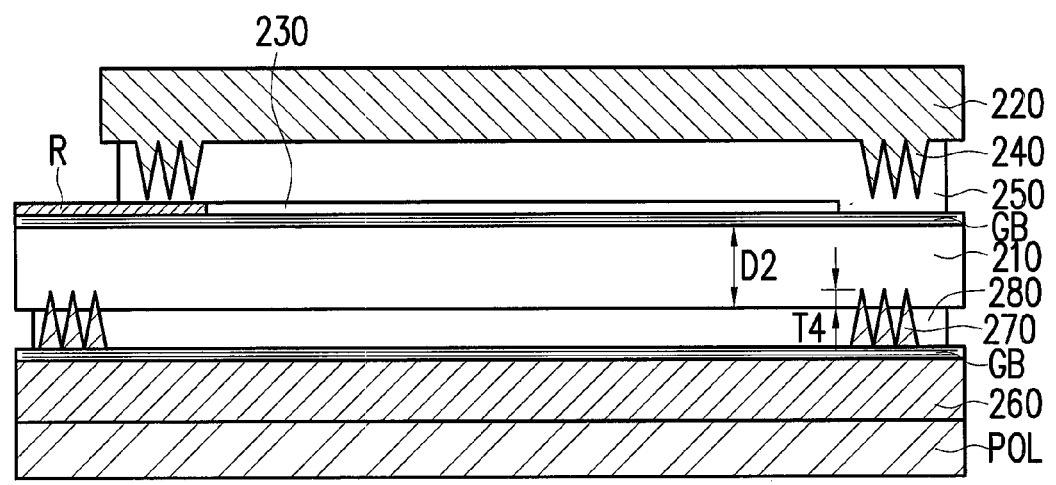
Figure 2D:
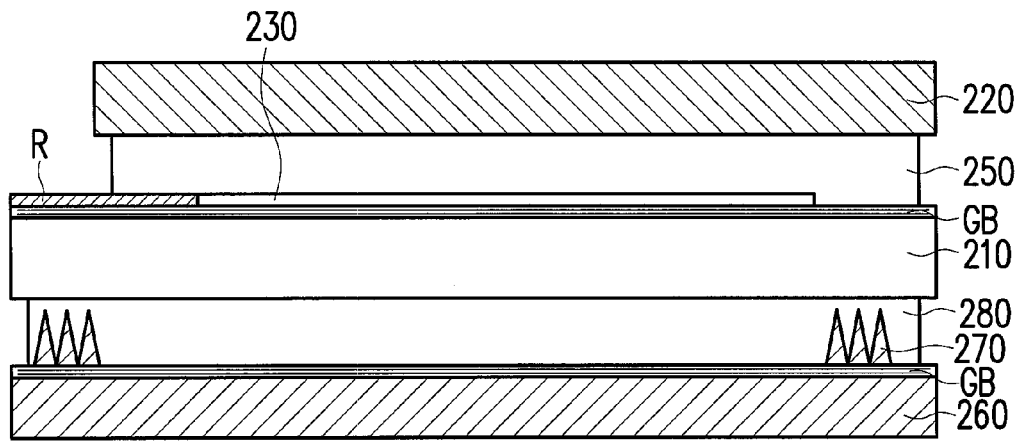
Figure 2E:
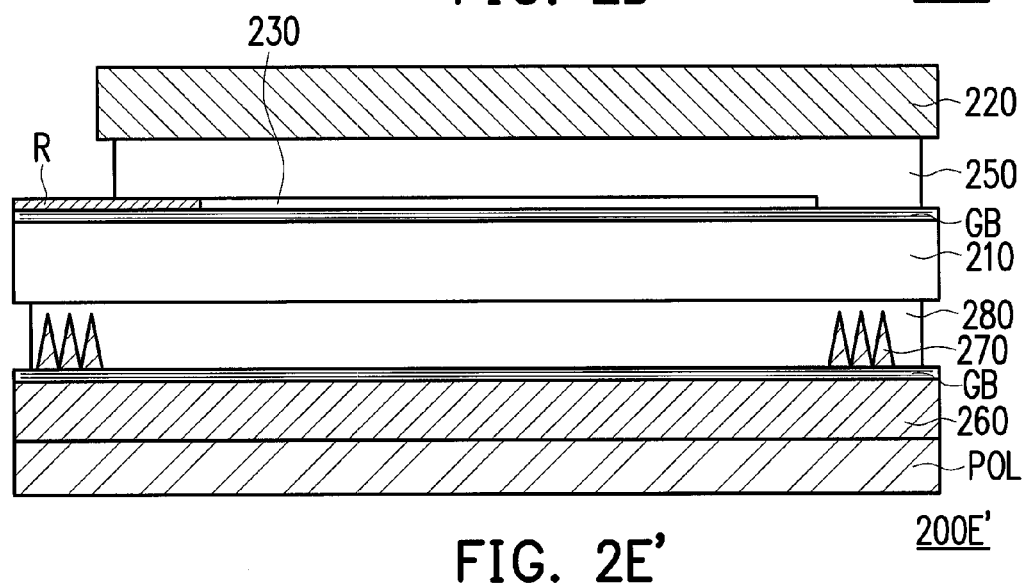
Figure 2F:
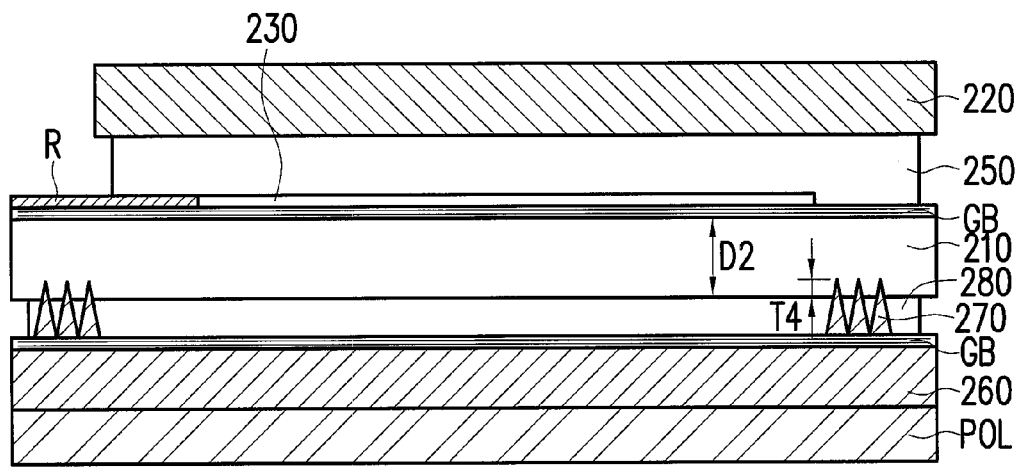

With reference to FIG. 2F, the environmental sensitive electronic device package 200F shown in FIG. 2F is similar to the environmental sensitive electronic device package 200E shown in FIG. 2E, while the difference therebetween lies in that the second side wall barrier structures 270 of the environmental sensitive electronic device package 200F are embedded in the first substrate 210. An embedded depth T4 of each of the second side wall barrier structures 270 in the first substrate 210 is less than the thickness D2 of the first substrate 210, for instance, and the hardness of the second side wall barrier structures 270 is preferably greater than the hardness of the first substrate 210. After the third substrate 260 is laminated onto the first substrate 210, the third substrate 260 is closely bonded to the first substrate 210 through the second adhesive 280 by means of a properly exerted force from a roller or frame press, and the second side wall barrier structures 270 may be easily embedded in the first substrate 210. The embedded depth T4 of each of the second side wall barrier structures 240 in the first substrate 210 is subject to the manufacturing process. During the roller pressing process or the frame pressing process, the exerted force may not be accurately controlled; therefore, the height of each second side wall barrier structure 270 is in principle less than the thickness D2 of the first substrate 210, for instance, so as to prevent the second side wall barrier structures 270 from penetrating the first substrate 210.

The first side wall barrier structures 240 in the environmental sensitive electronic device package 200F may also be embedded in the first substrate 210 in an exemplary embodiment that is not shown herein, so as to effectively enhance the capability of the environmental sensitive electronic device package 200F for blocking moisture and oxygen. Thereby, the lifetime of the environmental sensitive electronic device 230 may be extended.

FIG. 2D' to FIG. 2F' are schematic cross-sectional diagrams respectively illustrating an environmental sensitive electronic device package according to another exemplary embodiment. With reference to FIG. 2D' to FIG. 2F', the environmental sensitive electronic device packages 200D' to 200F' of FIG. 2D' to FIG. 2F' are similar to the environmental sensitive electronic device packages 200D to 200F of FIG. 2D to FIG. 2F respectively, while the difference therebetween lies in that the environmental sensitive electronic device packages 200D' to 200F' would not include the first side wall barrier structures 240 disposed on the second substrate 220. Through the first adhesive 250 that covers the environmental sensitive electronic device 230 and the first side wall barrier structures 270 disposed on the third substrate 260, the capability of blocking moisture and oxygen may also be effectively enhanced. Thereby, the lifetime of the environmental sensitive electronic device 230 may be extended.

Each of the aforesaid environmental sensitive electronic device packages 200A to 200F has the cavity AV in which the driver circuit R is configured. Thereby, the driver circuit R may not be squeezed and damaged during the packaging process, so as to ensure that the driver circuit R may be electrically connected to the environmental sensitive electronic device 230. In addition, the side wall barrier structures respectively in the environmental sensitive electronic device packages 200A to 200F may also be embedded in the substrate, so as to effectively enhance the capability of the environmental sensitive electronic device packages 200A to 200F for blocking moisture and oxygen. Thereby, the lifetime of the environmental sensitive electronic device 230 may be extended.

FIG. 3A is a schematic cross-sectional diagram illustrating an environmental sensitive electronic device package according to another exemplary embodiment. With reference to FIG. 3A, the environmental sensitive electronic device package 300A includes a first package substrate 310, a second package substrate 320, a carrier substrate 330, an environmental sensitive electronic device 340, at least one side wall barrier structure 350, and an adhesive 360. The second package substrate 320 is located above the first package substrate 310. The carrier substrate 330 is located above the first package substrate 310 and between the first package substrate 310 and the second package substrate 320. The environmental sensitive electronic device 340 is located on the carrier substrate 330 and between the carrier substrate 330 and the second package substrate 320. The side wall barrier structure 350 is located between the first package substrate 310 and the second package substrate 320, and at least one portion of the side wall barrier structure 350 surrounds the environmental sensitive electronic device 340. The adhesive 360 is located between the first package substrate 310 and the second package substrate 320, and the adhesive 360 covers the carrier substrate 330, the environmental sensitive electronic device 340, and the side wall barrier structure 350.

In the present exemplary embodiment, the first package substrate 310, the second package substrate 320, and the carrier substrate 330 are flexible substrates, for instance, and the material of the flexible substrates may be PET, PEN, PES, PMMA, PC, PI, or metal foil. The first package substrate 310, the second package substrate 320, and the carrier substrate 330 may also be rigid substrates made of metal, glass, or the like, which should not be construed as a limitation to the disclosure. The carrier substrate 330 is adhered to the first package substrate 310 through an optical adhesive 332.

The environmental sensitive electronic device 340 is, for instance, an active environmental sensitive electronic display device or a passive environmental sensitive electronic display device. The active environmental sensitive electronic display device is, for instance, an AM-OLED, an AM-EPD commonly known as electronic paper, an AM-LCD, or an AMBPLCD. The passive environmental sensitive electronic display device is, for instance, a PM-OLED or a STN-LCD.

With reference to FIG. 3A, in the present exemplary embodiment, there are a number of side wall barrier structures 350, for instance, and a shape of a cross-section of each side wall barrier structure 350 perpendicular to the first package substrate 310 may be a triangular shape, a trapezoidal shape, a rectangular shape, a polygonal shape, a circular shape, or an elliptic shape. Preferably, the cross-section of each side wall barrier structure 350 perpendicular to the first package substrate 310 is shaped as a triangle. The side wall barrier structures 350 may be made of a combination of organic and inorganic materials. The organic material may be PI photoresist, and the inorganic material may be a silicon compound, an aluminum compound, a diamond like carbon film, and so forth. The triangular cross-section may be formed by performing a photolithography process on the organic material, and the inorganic material is coated onto the triangular cross-section through CVD or sputtering, for instance. The triangular cross-section is formed on the first package substrate 310 or the second package substrate 320. The cross-section may be made of metal or metal alloy and may be formed on the first package substrate 310 or the second package substrate 320 through photolithography and etching, printing, or precision machining. The cross-section may also be made of glass and may be formed on the first package substrate 310 or the second package substrate 320 through photolithography and etching or sandblasting, for instance. In the present exemplary embodiment, the side wall barrier structures 350 are placed on the first package substrate 310, for instance. According to other embodiments that are not shown herein, the side wall barrier structures 350 may be located on the second package substrate 320. The gas barrier film GB is placed between the first package substrate 310 and the side wall barrier structures 350, and the gas barrier film GB includes an organic film and an inorganic film. The inorganic film may refer to metal oxide, metal nitride, metal oxynitride, silicon oxide, silicon nitride, silicon oxynitride, and so on. In most cases, the gas impermeability of the inorganic film is greater than that of the organic film, while the organic film has favorable flexibility.

The adhesive 360 is, for instance, made of acrylic or epoxy resin that may be cured by ultraviolet light or heat, such that the first package substrate 310 is closely bonded to the second package substrate 320. In the present exemplary embodiment, before the adhesive 360 is cured, the adhesive 360 is of a liquid type or a sheet type, for instance. The environmental sensitive electronic device package 300A described herein is capable of blocking moisture and oxygen. Thereby, the lifetime of the environmental sensitive electronic device 340 may be extended.

Different types of environmental sensitive electronic device packages 300B to 300H are described hereinafter with reference to FIG. 3B to FIG. 3H. The same or similar reference numbers used in each of the following exemplary embodiments represent the same or the like elements, and thus descriptions of the same or the like elements will not be repeatedly provided hereinafter.

Figure 3D:
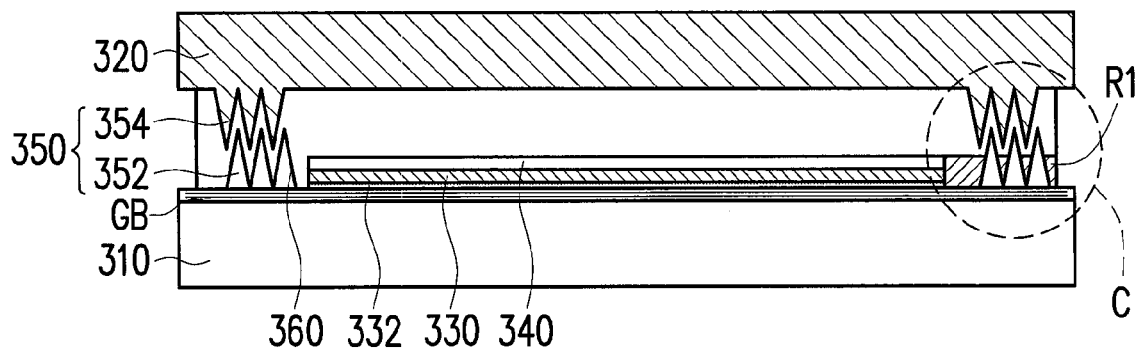
Figures 1, 3D:
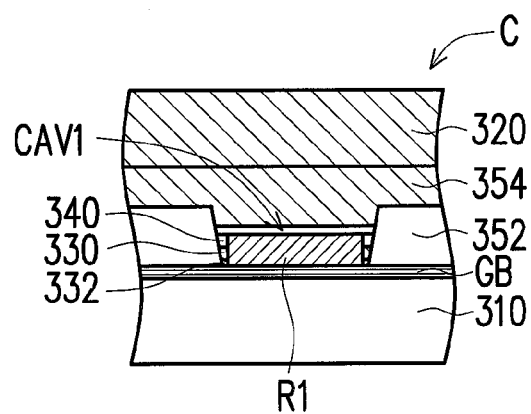
Figure 3E:
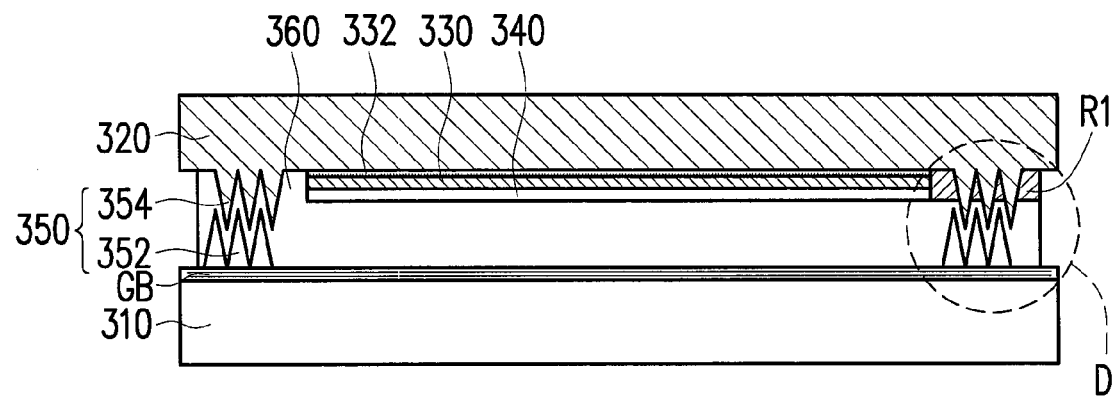
FIG. 3E is a schematic cross-sectional diagram illustrating an environmental sensitive electronic device package according to another exemplary embodiment.
Figures 1, 3E:
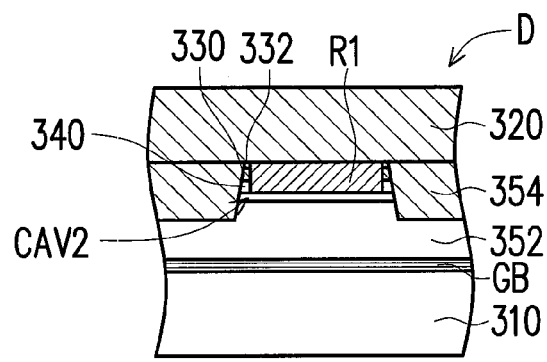
Figure 3F:
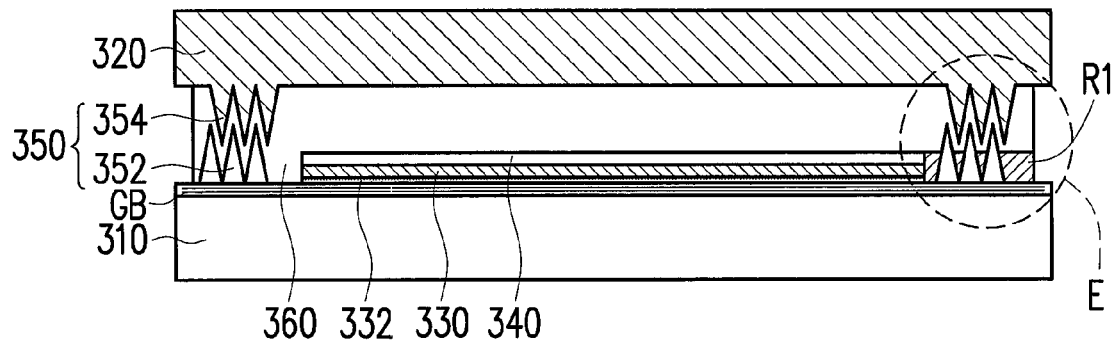
FIG. 3F is a schematic cross-sectional diagram illustrating an environmental sensitive electronic device package according to another exemplary embodiment.
Figures 1, 3F:
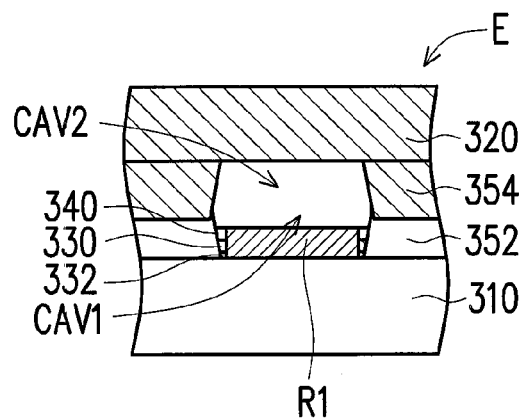

FIG. 3B to FIG. 3H are schematic cross-sectional diagrams illustrating an environmental sensitive electronic device package according to another exemplary embodiment. FIG. 3D-1 is a partial side view illustrating a region C in the environmental sensitive electronic device package depicted in FIG. 3D. FIG. 3E-1 is a partial side view illustrating a region D in the environmental sensitive electronic device package depicted in FIG. 3E. FIG. 3F-1 is a partial side view illustrating a region E in the environmental sensitive electronic device package depicted in FIG. 3F. With reference to FIG. 3B, the environmental sensitive electronic device package 300B shown in FIG. 3B is similar to the environmental sensitive electronic device package 300A shown in FIG. 3A, while the difference therebetween lies in that the side wall barrier structures 350 of the environmental sensitive electronic device package 300B include at least one first side wall barrier structure 352 and at least one second side wall barrier structure 354. The first side wall barrier structure 352 is located on the first package substrate 310, and the second side wall barrier structure 354 is located on the second package substrate 320. A shape of a cross-section of each of the first and second side wall barrier structures 352 and 354 perpendicular to the first package substrate 310 includes a triangular shape, a trapezoidal shape, a rectangular shape, a polygonal shape, a circular shape, or an elliptic shape. Preferably, the cross-section of each of the first and second side wall barrier structures 352 and 354 perpendicular to the first package substrate 310 is shaped as a triangle. The first and second side wall barrier structures 352 and 354 are alternately arranged between the first package substrate 310 and the second package substrate 320. The environmental sensitive electronic device package 300B described herein is capable of blocking moisture and oxygen. Thereby, the lifetime of the environmental sensitive electronic device 340 may be extended.

With reference to FIG. 3C, the environmental sensitive electronic device package 300C shown in FIG. 3C is similar to the environmental sensitive electronic device package 300B shown in FIG. 3B, while the difference therebetween lies in that the first side wall barrier structure 352 of the environmental sensitive electronic device package 300C is aligned to the second side wall barrier structure 354, for instance. The environmental sensitive electronic device package 300C described herein is capable of blocking moisture and oxygen. Thereby, the lifetime of the environmental sensitive electronic device 340 may be extended.

With reference to FIG. 3D and FIG. 3D-1, the environmental sensitive electronic device package 300D shown in FIG. 3D is similar to the environmental sensitive electronic device package 300B shown in FIG. 3B, while the difference therebetween lies in that the environmental sensitive electronic device package 300D shown in FIG. 3D further includes a driver circuit R1 that is located between the first package substrate 310 and the second package substrate 320. The first side wall barrier structure 352 has a first cavity CAV1, and the driver circuit R1 is located in the first cavity CAV1. That is, the driver circuit R1 which is configured in the first cavity CAV1 may not be squeezed and damaged during the packaging process, so as to ensure that the driver circuit R1 may be electrically connected to the environmental sensitive electronic device 340.

With reference to FIG. 3E and FIG. 3E-1, the environmental sensitive electronic device package 300E shown in FIG. 3E is similar to the environmental sensitive electronic device package 300B shown in FIG. 3B, while the difference therebetween lies in that the carrier substrate 330 of the environmental sensitive electronic device package 300E is adhered to the second package substrate 320 by means of an optical adhesive 332. The environmental sensitive electronic device 340 is located on the carrier substrate 330 and between the carrier substrate 330 and the first package substrate 310. The environmental sensitive electronic device package 300E further includes a driver circuit R1 that is located between the first package substrate 310 and the second package substrate 320. The second side wall barrier structure 354 has a second cavity CAV2, and the driver circuit R1 is located in the second cavity CAV2. The driver circuit R1 which is configured in the second cavity CAV2 may not be squeezed and damaged during the packaging process, so as to ensure that the driver circuit R1 may be electrically connected to the environmental sensitive electronic device 340.

With reference to FIG. 3F and FIG. 3F-1, the environmental sensitive electronic device package 300F shown in FIG. 3F is similar to the environmental sensitive electronic device package 300D shown in FIG. 3D, while the difference therebetween lies in that the second side wall barrier structures 354 of the environmental sensitive electronic device package 300F has a second cavity CAV2, and the driver circuit R1 is located between the first cavity CAV1 and the second cavity CAV2. The driver circuit R1 which is configured between the first cavity CAV1 and the second cavity CAV2 may not be squeezed and damaged during the packaging process, so as to ensure that the driver circuit R1 may be electrically connected to the environmental sensitive electronic device 340.

Figure 3G:
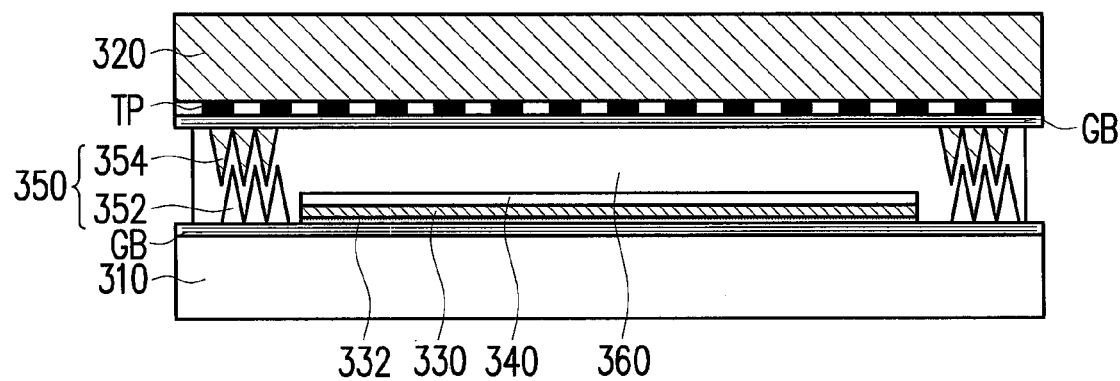
FIG. 3G to FIG. 3H are schematic cross-sectional diagrams illustrating an environmental sensitive electronic device package according to another exemplary embodiment.

With reference to FIG. 3G, the environmental sensitive electronic device package 300G shown in FIG. 3G is similar to the package 300F shown in FIG. 3F, while the difference therebetween lies in that the environmental sensitive electronic device package 300G shown in FIG. 3G further includes a touch-sensing layer TP that is located on the second package substrate 320 and between the adhesive 360 and the second package substrate 320. The touch-sensing layer TP described herein may be directly formed on the second package substrate 320 or may be bonded to the second package substrate 320 through an optical adhesive (not shown); therefore, the touch-sensing layer TP is, for instance, located between the gas barrier film GB and the second package substrate 320, and the second side wall barrier structure 354 is located on the gas barrier film GB, i.e., the second package substrate 320 and the second side wall barrier structure 354 are located at two respective side of the touch-sensing layer TP. In the present exemplary embodiment, the second side wall barrier structure 354 may be made of a combination of organic and inorganic materials. The organic material may be PI photoresist, and the inorganic material may be a silicon compound, an aluminum compound, a diamond like carbon film, and so forth. The triangular cross-section may be formed by performing a photolithography process on the organic material, and the inorganic material is coated onto the triangular cross-section through CVD or sputtering, for instance. The triangular cross-section is formed on the second package substrate 320.

Figure 3H:
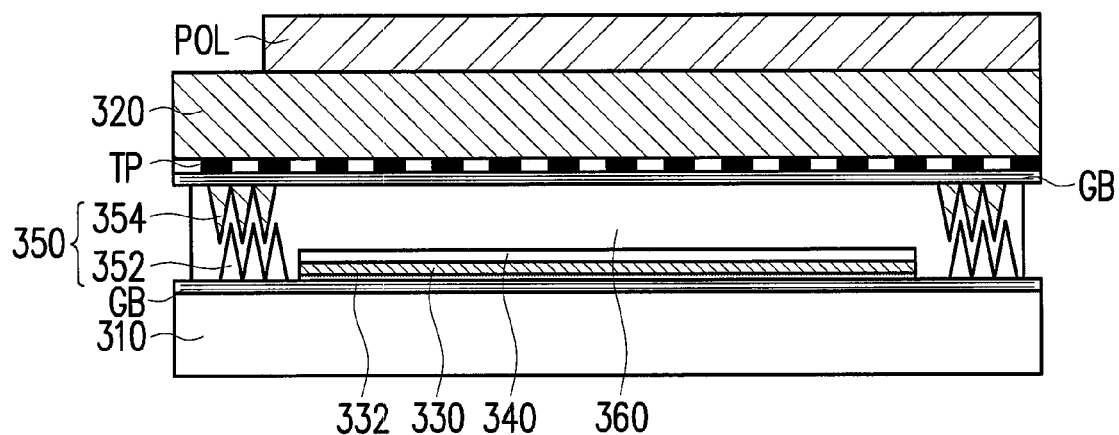

With reference to FIG. 3H, the environmental sensitive electronic device package 300H shown in FIG. 3H is similar to the environmental sensitive electronic device package 300G shown in FIG. 3G, while the difference therebetween lies in that the environmental sensitive electronic device package 300H shown in FIG. 3H further includes a quarter-wave compensating and polarizing film POL that is located on the second package substrate 320, and the adhesive 360 and the quarter-wave compensating and polarizing film POL are located at two respective sides of the second package substrate 320. In the quarter-wave compensating and polarizing film POL, the compensating film refers to a phase retardation film whose retardation has a magnitude of a quarter of a specific wavelength $\lambda$ for the wavelength $\lambda$, for instance.

Each of the environmental sensitive electronic device packages 300A to 300H has the carrier substrate 330, and the environmental sensitive electronic device package 340 is located on the carrier substrate 330. In another aspect, the side wall barrier structure 350 is located on the first package substrate 310 and/or the second package substrate 320 and surrounds the environmental sensitive electronic device package 340, so as to effectively block external moisture and oxygen and further extend the lifetime of the electronic device. The side wall barrier structure 350 has the first cavity CAV1 and/or the second cavity CAV2, for instance, such that the driver circuit R1 configured in the first cavity CAV1 and/or the second cavity CAV2 may not be squeezed and damaged during the packaging process, and thereby the driver circuit R1 may be electrically connected to the environmental sensitive electronic device 340.

Figure 4A:
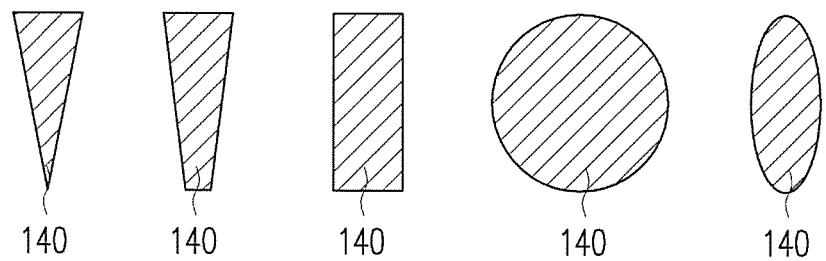
FIG. 4A to FIG. 4F respectively illustrate possible shapes of a cross-section of each first, second or third side wall barrier structure perpendicular to a first substrate.
Figure 4B:
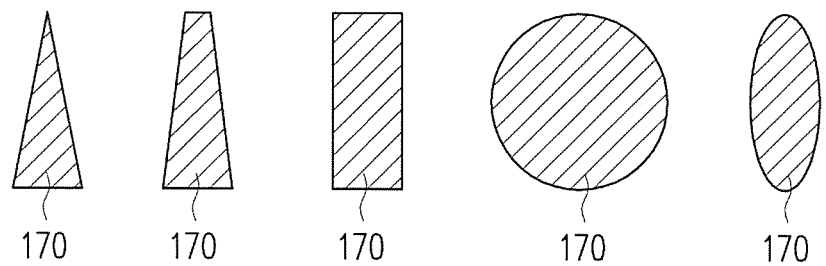
Figure 4C:
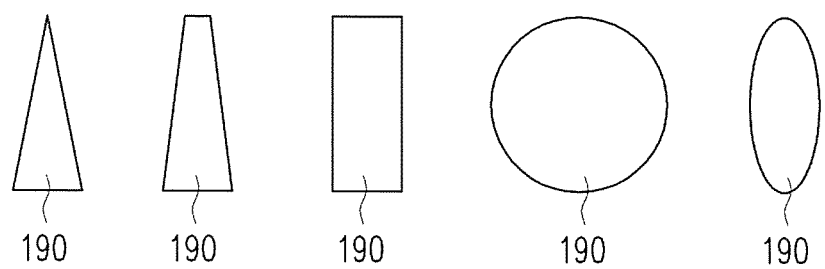
Figure 4D:
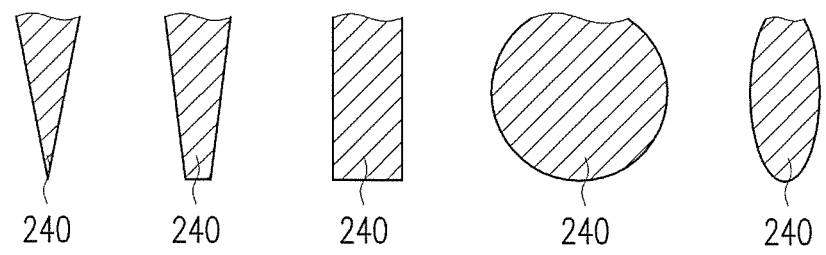
Figure 4E:
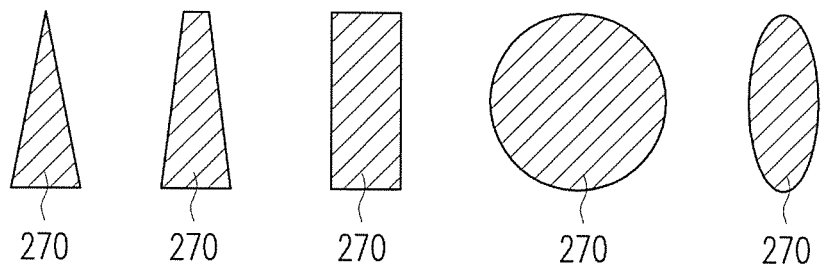
Figure 4F:
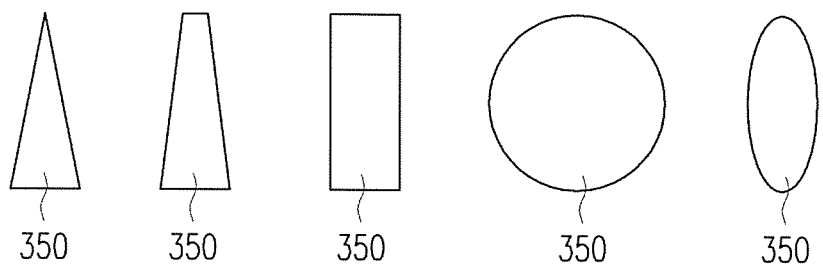
Figure 4G:
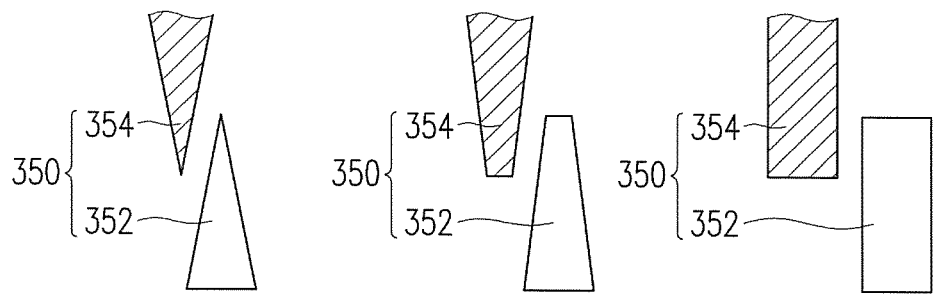
FIG. 4G illustrates possible shapes of a cross-section of at least one side wall barrier structure perpendicular to a first package substrate.
Figure 4G:
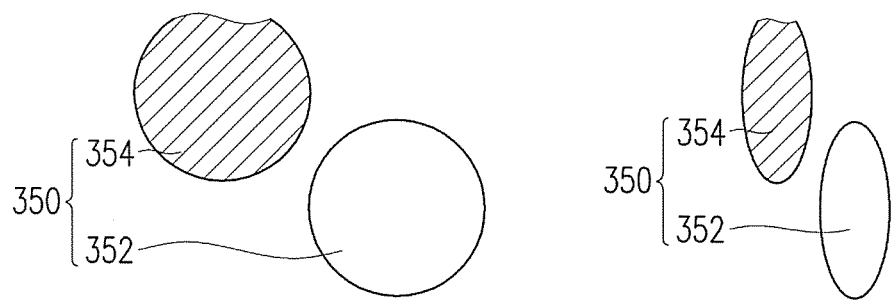

FIG. 4A to FIG. 4F respectively illustrate possible shapes of a cross-section of each first, second or third side wall barrier structure perpendicular to a first substrate. FIG. 4G illustrates possible shapes of a cross-section of at least one side wall barrier structure perpendicular to a first package substrate. With reference to FIG. 4A to FIG. 4F, a shape of a cross-section of each first side wall barrier structure 170, 240, each second side wall barrier structure 140, 270 or each third side wall barrier structure 190 perpendicular to the first substrate 110, 210 may include a triangular shape, a trapezoidal shape, a rectangular shape, a polygonal shape, a circular shape, or an elliptic shape. With reference to FIG. 4G, a shape of a cross-section of each of the first and second side wall barrier structures 352 and 354 perpendicular to the first package substrate 310 may include a triangular shape, a trapezoidal shape, a rectangular shape, a polygonal shape, a circular shape, or an elliptic shape, and the first and second side wall barrier structures 352 and 354 can be alternately arranged. Preferably, the cross-section of each of the first, second and third side wall barrier structures 140, 170, 190, 240, 270, 352, and 354 perpendicular to the first substrate 110, 210 or the first package substrate 310 is shaped as a triangle, as shown in FIG. 1 to FIG. 3. However, the disclosure is not limited thereto.

The side wall barrier structure of the environmental sensitive electronic device package described herein is located between two adjacent substrates, and the side wall barrier structure surrounds the environmental sensitive electronic device. The side wall barrier structure is located on one of the substrates and extended toward the other substrate, so that the side wall barrier structure may be embedded in the other substrate. Since the environmental sensitive electronic device package is capable of blocking moisture and oxygen, the environmental sensitive electronic device described herein may have an extended lifetime. That is, the side wall barrier structure may be further equipped a cavity where the driver circuit is configured. The driver circuit may not be squeezed and damaged during the packaging process, so as to ensure that the driver circuit may be electrically connected to the environmental sensitive electronic device.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. An environmental sensitive electronic device package comprising:
a first substrate;
a second substrate located above the first substrate;
an environmental sensitive electronic device located on the first substrate and between the first substrate and the second substrate;
a first adhesive located between the first substrate and the second substrate, the first adhesive covering the environmental sensitive electronic device;
a third substrate located below the first substrate, the first substrate being located between the second substrate and the third substrate;
at least one first side wall barrier structure located on the third substrate and between the first substrate and the third substrate, wherein the at least one first side wall barrier structure is embedded in the first substrate; and
a second adhesive located between the first substrate and the third substrate, the second adhesive covering the at least one first side wall barrier structure.

2. The environmental sensitive electronic device package of claim 1, wherein a shape of a cross-section of the at least one first side wall barrier structure perpendicular to the first substrate comprises a triangular shape, a trapezoidal shape, a rectangular shape, a polygonal shape, a circular shape, or an elliptic shape.

3. The environmental sensitive electronic device package of claim 1, wherein an embedded depth of the at least one first side wall barrier structure in the first substrate is less than a thickness of the first substrate.

4. The environmental sensitive electronic device package of claim 1, wherein a hardness of the at least one first side wall barrier structure is greater than a hardness of the first substrate.

5. The environmental sensitive electronic device package of claim 1, further comprising a touch-sensing layer located on the second substrate and between the second substrate and the first adhesive.

6. The environmental sensitive electronic device package of claim 5, further comprising a quarter-wave compensating and polarizing film located on the second substrate, the second substrate being located between the quarter-wave compensating and polarizing film and the touch-sensing layer.

7. The environmental sensitive electronic device package of claim 1, further comprising a color filter layer located on the second substrate and between the second substrate and the first adhesive.

8. The environmental sensitive electronic device package of claim 1, further comprising a quarter-wave compensating and polarizing film located on the second substrate, the second substrate being located between the quarter-wave compensating and polarizing film and the first adhesive.

9. The environmental sensitive electronic device package of claim 1, further comprising a second side wall barrier structure disposed on the second substrate, wherein the at least one second side wall barrier structure surrounds the environmental sensitive electronic device and is located between the first substrate and the second substrate, and the first adhesive covers the at least one second side wall barrier structure.

10. The environmental sensitive electronic device package of claim 9, wherein the at least one second side wall barrier structure is embedded in the first substrate, and an embedded depth of the at least one second side wall barrier structure in the first substrate is less than a thickness of the first substrate.

11. The environmental sensitive electronic device package of claim 10, wherein the at least one first side wall barrier structure and the at least one second side wall barrier structure are alternately arranged in the first substrate.

12. The environmental sensitive electronic device package of claim 10, wherein the at least one first side wall barrier structure is aligned to the at least one second side wall barrier structure.

13. The environmental sensitive electronic device package of claim 9, wherein a shape of a cross-section of the at least one second side wall barrier structure perpendicular to the first substrate comprises a triangular shape, a trapezoidal shape, a rectangular shape, a polygonal shape, a circular shape, or an elliptic shape.

14. The environmental sensitive electronic device package of claim 9, wherein a hardness of the at least one second side wall barrier structure is greater than a hardness of the first substrate.

15. The environmental sensitive electronic device package of claim 9, further comprising at least one third side wall barrier structure located on the first substrate, the at least one third side wall barrier structure and the at least one second side wall barrier structure being alternately arranged between the second substrate and the first substrate.

16. The environmental sensitive electronic device package of claim 15, wherein a shape of a cross-section of the at least one third side wall barrier structure perpendicular to the first substrate comprises a triangular shape, a trapezoidal shape, a rectangular shape, a polygonal shape, a circular shape, or an elliptic shape.

17. The environmental sensitive electronic device package of claim 15, further comprising a quarter-wave compensating and polarizing film located on the third substrate, the third substrate being located between the quarter-wave compensating and polarizing film and the second adhesive.

18. The environmental sensitive electronic device package of claim 17, further comprising a touch-sensing layer located on the third substrate and between the third substrate and the quarter-wave compensating and polarizing film.

19. The environmental sensitive electronic device package of claim 15, further comprising a touch-sensing layer located on the first substrate and between the first substrate and the first adhesive.

* * * * *